United States Patent
Katano et al.

(10) Patent No.: US 6,333,003 B1
(45) Date of Patent: Dec. 25, 2001

(54) TREATMENT APPARATUS, TREATMENT METHOD, AND IMPURITY REMOVING APPARATUS

(75) Inventors: Takayuki Katano, Nirasaki; Junichi Kitano, Kofu; Masami Akimoto, Kumamoto; Norio Semba, Kumamoto-ken, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/083,096

(22) Filed: May 22, 1998

(30) Foreign Application Priority Data

| May 22, 1997 | (JP) | 9-150191 |
| Jun. 6, 1997 | (JP) | 9-165221 |
| Jun. 19, 1997 | (JP) | 9-177792 |

(51) Int. Cl.[7] ............... A61L 9/14; B01D 47/06
(52) U.S. Cl. .............. 422/4; 118/326; 454/55; 55/338.1; 96/227; 95/199; 95/225
(58) Field of Search .............. 454/54, 55, 187, 454/236; 422/122, 4, 28; 55/338, 338.1; 96/223, 226, 227, 235, 242; 118/326; 95/199, 225

(56) References Cited

U.S. PATENT DOCUMENTS

| 4,537,120 | 8/1985 | Josefsson | 99/115.2 |
| 4,964,885 | 10/1990 | Wieser-Linhart | 55/8 |
| 5,143,552 | 9/1992 | Moriyama. | |
| 5,326,316 | 7/1994 | Hashimoto et al. . | |
| 5,397,546 | * 3/1995 | West et al. | 422/37 |
| 5,757,660 | * 5/1998 | Musow | 422/4 X |
| 5,944,894 | * 8/1999 | Kitano et al. | 118/326 |

FOREIGN PATENT DOCUMENTS

| 42 12711 | 10/1993 | (DE) . |
| 0 065 584 | 12/1982 | (EP) . |
| 0 530 081 | 3/1993 | (EP) . |
| 0 786 800 | 7/1997 | (EP) . |
| 93/01453 | 1/1993 | (WO) . |

* cited by examiner

Primary Examiner—Elizabeth McKane
(74) Attorney, Agent, or Firm—Rader, Fishman & Grauer, PLLC

(57) ABSTRACT

A treatment apparatus for treating a substrate in an isolated treatment space in an air-conditioned clean room, comprising a removing unit including a plurality of removing sections for recovering at least some of air in the treatment space and removing impurities from the recovered air, the removing sections being arranged in series and each including a supply mechanism for supplying an impurity remover capable of removing the impurities by touching the recovered air, a temperature adjustment unit for adjusting the temperature of the air cleared of the impurities by the removing unit, and a return circuit for returning the air, adjusted in temperature by the temperature adjustment unit, to the treatment space.

6 Claims, 13 Drawing Sheets

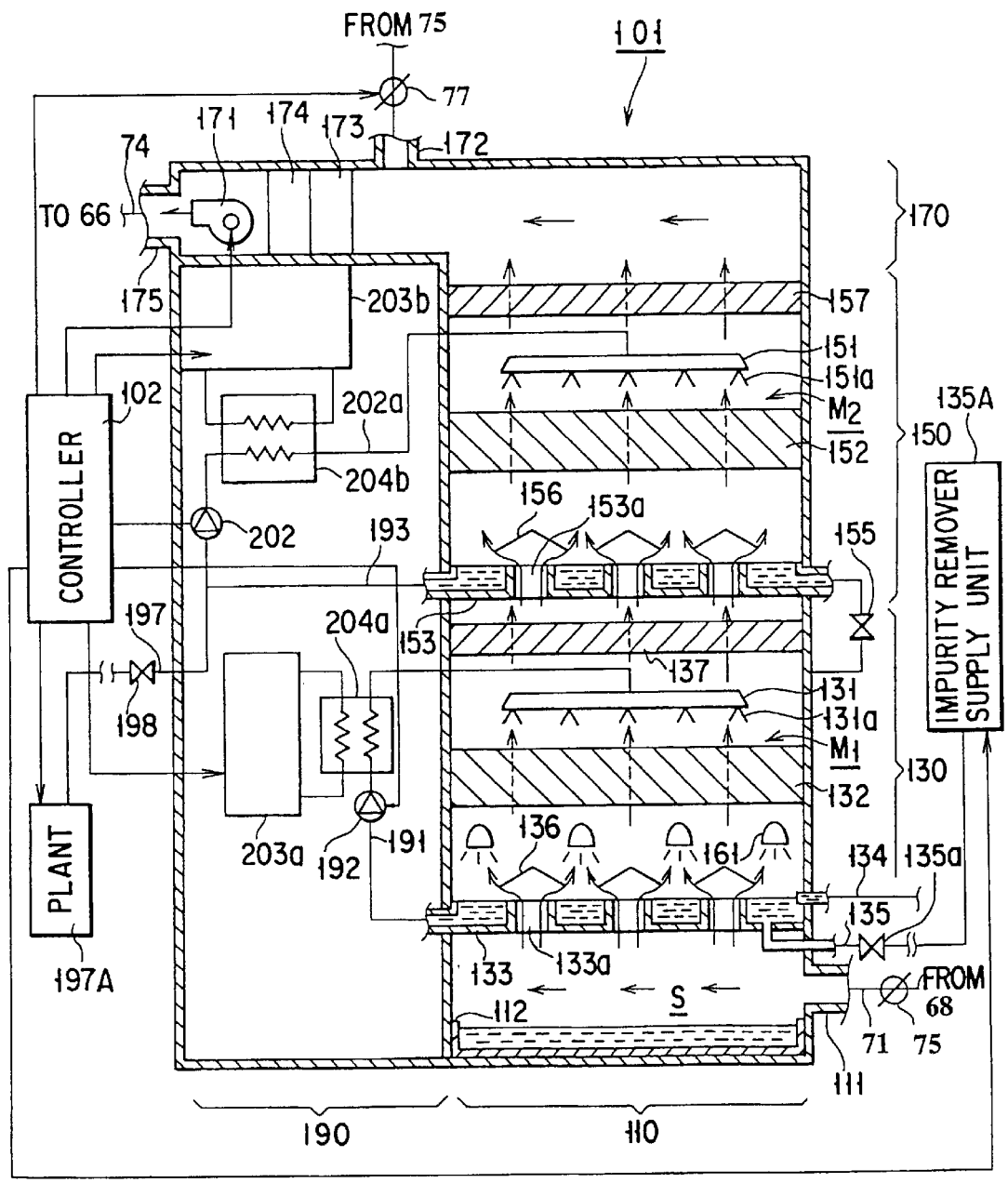
F I G. 6

TREATMENT APPARATUS, TREATMENT METHOD, AND IMPURITY REMOVING APPARATUS

BACKGROUND OF THE INVENTION

The present invention relates to a treatment apparatus for subjecting a substrate, such as a semiconductor wafer, to specific treatments in given spaces, a treatment method, and an impurity removing apparatus adapted for use with the treatment apparatus.

In a photoresist treatment process of a semi-conductor manufacturing method, for example, a resist film is formed by applying a resist to the surface of a substrate, such as a semiconductor wafer (hereinafter referred to simply as "wafer"), and the substrate is exposed to a given pattern and developed with a developing agent. Conventionally, this series of treatments is carried out by means of a coating/developing apparatus in which individual treatment units are arranged intensively and systematized.

Usually, the coating/developing apparatus comprises a plurality of treatment units. These treatment units include, for example, a treatment unit for an adhesion treatment for improving the grab of the resist, a resist treatment for applying the resist, a heat-treatment unit for keeping the exposed substrate in an atmosphere of a given temperature, and a developing unit for developing the exposed substrate with the developing agent. The substrate or wafer is loaded into or unloaded from these individual treatment units for specific treatments by means of a transportation mechanism such as a transfer arm.

Since the treatments require a clean atmosphere, the coating/developing apparatus is set in a clean room, and regions around or over the apparatus are surrounded by suitable panels. Provided in the upper portion of the apparatus is a cleaned air supply unit, such as the so-called fan-filter unit (FFU) that integrally combines a fan and a filter. The treatment units are located under down flows of cleaned air from the FFU. In order to remove alkaline components, such as ammonia, in the atmosphere in the coating/developing apparatus, a chemical filter is disposed independently on the upper-stream side of the FFU.

As modern semiconductor devices become more highly integrated, the line widths of patterns become finer and finer. To cope with this, the resist is formed of a material capable of chemical amplification. If this resist material reacts with ammonia in the atmosphere, however, a slightly soluble or insoluble neutralized layer is inevitably formed on the surface of the substrate, adversely affecting subsequent treatments. Accordingly, the ammonia and other alkaline components in the atmosphere in the coating/developing apparatus must be minimized in quantity. The formation of the neutralized layer can be prevented by restricting the quantity of the alkaline components to, for example, 1 ppb or less.

The life performance of the so-called chemical filter set in the conventional coating/developing apparatus depends on the humidity in the system, the quantity of alkaline components, and the flow rate (per unit time) of air passing through the chemical filter. Therefore, the time for the replacement of the chemical filter cannot be predicted with ease, and the replacement requires the whole system to be stopped, resulting in reduction in throughput. Besides, the chemical filter is expensive, so that the running costs are increased.

Accordingly, the inventors hereof attempted to remove alkaline components in an atmosphere by means of the so-called gas-liquid contact with an impurity remover instead of using the chemical filter.

If impurities, such as alkaline components, contained by the atmosphere in the coating/developing apparatus are removed simply by the gas-liquid contact, however, they cannot enjoy high removal efficiency. In the case where the impurity concentration of the atmosphere is high, the impurities cannot be easily removed to the degree high enough to maintain the appropriate cleanness of the atmosphere in the systematized apparatus. Further, the impurity remover, e.g., pure water, which is used for the gas-liquid contact, entails a nonnegligible running cost.

In the case where pure water is used as the impurity remover, for example, microorganisms, such as sundry germs, algae, etc., may possibly multiply if the water is circulated. These multiplied microorganisms cause clogging of piping in a circulation system, degeneration of the impurity remover itself, etc. Accordingly, the impurity removing capacity of the remover is lowered, so that suitable atmospheres cannot be maintained in given spaces in the treatment apparatus. Thus, it is necessary periodically to discharge the entire impurity remover from the apparatus and disassemble and clean associated devices, and in some cases, to replace some components. During periodic cleaning operation for an impurity removing apparatus, moreover, the treatment apparatus, as well as the removing apparatus, must be stopped, and the throughput is lowered also for this reason.

BRIEF SUMMARY OF THE INVENTION

An object of the present invention is to provide a treatment apparatus capable of suitably treating a substrate after efficiently removing impurities, such as alkaline components, in an atmosphere by gas-liquid contact without the use of a chemical filter.

Another object of the invention is to provide a treatment apparatus capable of suitably maintaining the impurity removing capacity and lengthening the maintenance cycle.

Still another object of the invention is to provide a treatment method for treating a substrate by effectively using the treatment apparatus.

A further object of the invention is to provide an impurity removing apparatus best suited for use in the treatment apparatus.

A treatment apparatus according to the present invention is an apparatus for treating a substrate in an isolated treatment space in an air-conditioned clean room, which comprises: a removing unit including a plurality of removing sections for recovering at least some of air in the treatment space and removing impurities from the recovered air, the removing sections being arranged in series and each including a supply mechanism for supplying an impurity remover capable of removing the impurities by touching the recovered air; a temperature adjustment unit for adjusting the temperature of the air cleared of the impurities by the removing unit; and a return circuit for returning the air, adjusted in temperature by the temperature adjustment unit, to the treatment space.

Another treatment apparatus according to the invention is an apparatus for treating a substrate in an isolated treatment space in an air-conditioned clean room, which comprises: a removing unit for recovering at least some of air in the treatment space and removing impurities from the recovered air by spraying an impurity remover against the recovered air; a return circuit for returning the air cleared of the impurities by the removing unit to the treatment space; a circulation circuit for circulating at least some of the impurity remover to be reused; and a sterilizer unit for sterilizing the impurity remover circulating in the circulation circuit.

"Sterilization" used herein implies an act of preventing microorganisms from multiplying in the impurity remover, as well as an act of destroying the microorganisms in the remover.

Still another treatment apparatus according to the invention an apparatus for treating a substrate in an isolated treatment space in an air-conditioned clean room, which comprises: a removing unit for recovering at least some of air in the treatment space and removing impurities from the recovered air by spraying an impurity remover against the recovered air; a return circuit for returning the air cleared of the impurities by the removing unit to the treatment space; a circulation circuit for circulating at least some of the impurity remover to be reused; and a biocide supply unit for supplying a biocide to the impurity remover in the circulation circuit.

A treatment method according to the invention is a method for treating a substrate in an isolated treatment space in an air-conditioned clean room, which comprises: (a) a process for preparing a removing unit for recovering at least some of air in the treatment space and removing impurities from the recovered air by spraying an impurity remover against the recovered air, a return circuit for returning the air cleared of the impurities by the removing unit to the treatment space, a circulation circuit for circulating at least some of the impurity remover to be reused, and a biocide supply unit for supplying a biocide to the impurity remover in the circulation circuit; (b) a first process for stopping the operation of the removing unit; (c) a second process for discharging at least the impurity remover in the circulation circuit; and (d) a third process for supplying the biocide to the circulation circuit by means of the biocide supply unit.

Another treatment method according to the invention is a method for treating a substrate in an isolated treatment space in an air-conditioned clean room, which comprises: (A) a process for preparing a removing unit for recovering at least some of air in the treatment space and removing impurities from the recovered air by spraying an impurity remover against the recovered air, a return circuit for returning the air cleared of the impurities by the removing unit to the treatment space, a circulation circuit for circulating at least some of the impurity remover to be reused, and a biocide supply unit for supplying a biocide to the impurity remover in the circulation circuit; (B) a first process for stopping the operation of the removing unit; (C) a second process for supplying the biocide to at least the impurity remover in the circulation circuit by means of the biocide supply unit.

An impurity removing apparatus according to the invention is an apparatus used to supply cleaned air to a treatment apparatus for treating a substrate in an isolated treatment space in an air-conditioned clean room, which comprises a passage through which at least some of air in the treatment space is recovered and made to flow upward and impurity removing sections in the passage, each of the impurity removing sections including a dispersion mat formed of woven or nonwoven fabric, a nozzle for spraying an impurity remover upstream against the dispersion mat from a position at a distance from the dispersion mat in the passage, and a liquid drop removing filter situated on the lower-stream side of the nozzle and formed of woven or nonwoven fabric having fiber diameters smaller than those of the material of the dispersion mat.

Another impurity removing apparatus according to the invention is an apparatus used to supply cleaned air to a treatment apparatus for treating a substrate in an isolated treatment space in an air-conditioned clean room, which comprises a passage through which at least some of air in the treatment space is recovered and made to flow horizontally and impurity removing sections in the passage, each of the impurity removing sections including a dispersion mat formed of woven or nonwoven fabric and set parallel to the flow of the recovered air, a nozzle for spraying an impurity remover against the dispersion mat in a direction perpendicular to the flow of the recovered air, from a position at a distance from the dispersion mat, and a liquid drop removing filter situated on the lower-stream side of the nozzle and formed of woven or nonwoven fabric having fiber diameters smaller than those of the material of the dispersion mat.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a sectional view schematically showing an impurity removing apparatus used in the treatment apparatus;

DETAILED DESCRIPTION OF THE INVENTION

Preferred embodiments of the present invention will now be described with reference to the accompanying drawings.

Figure 1:
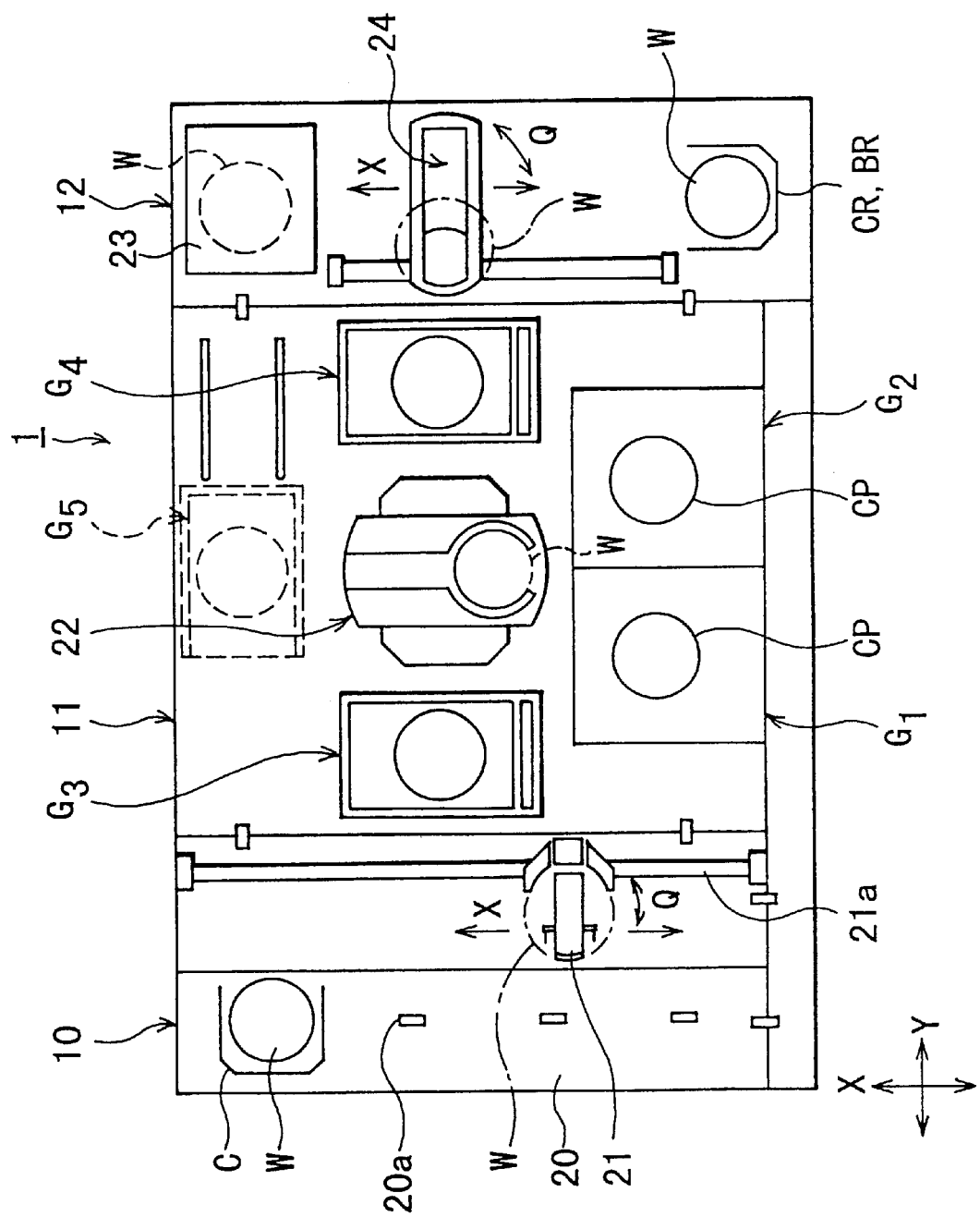
FIG. 1 is a plan view schematically showing a treatment apparatus according to the present invention.
Figure 2:
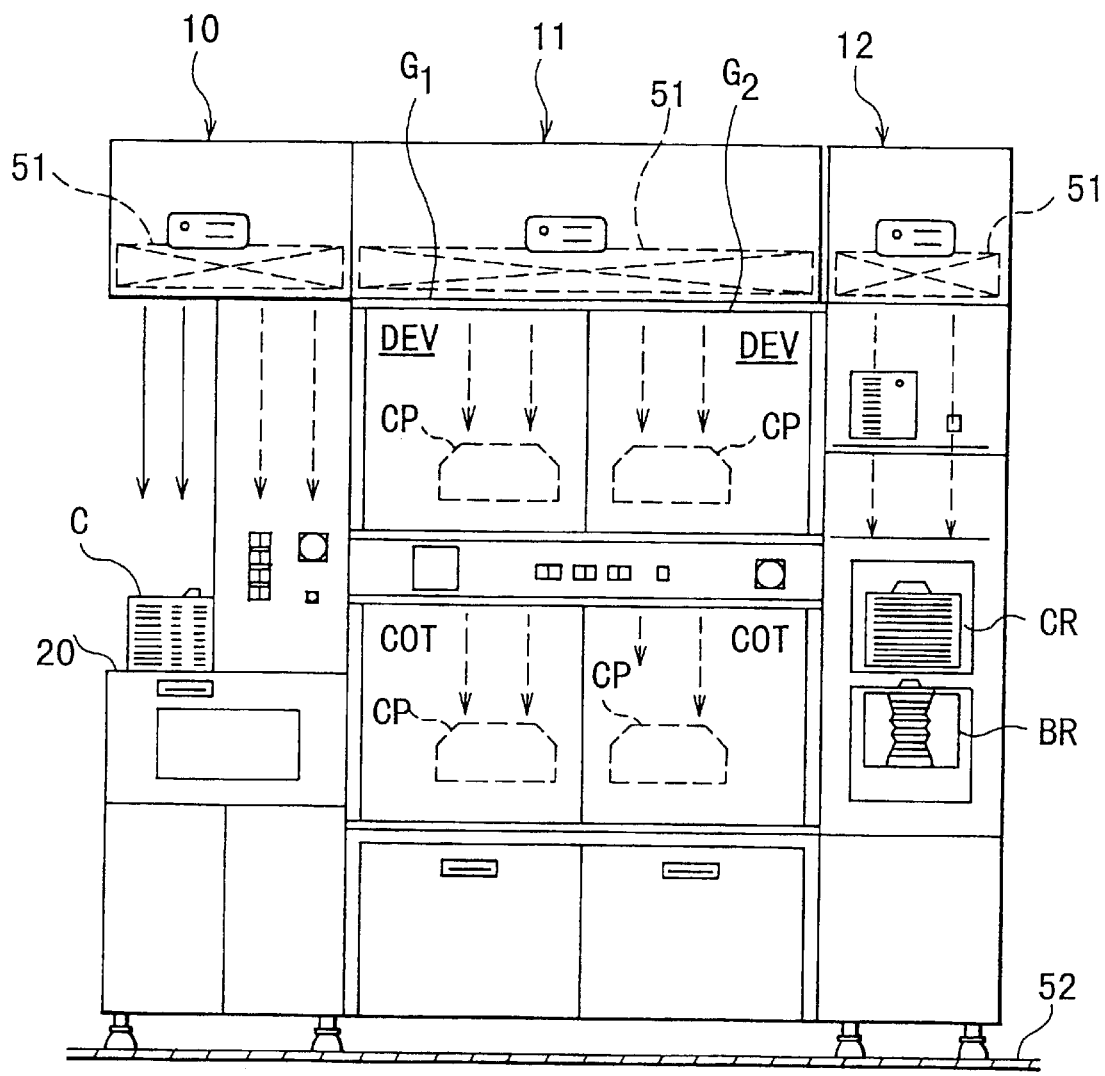
FIG. 2 is a front view schematically showing the treatment apparatus of the invention.
Figure 3:
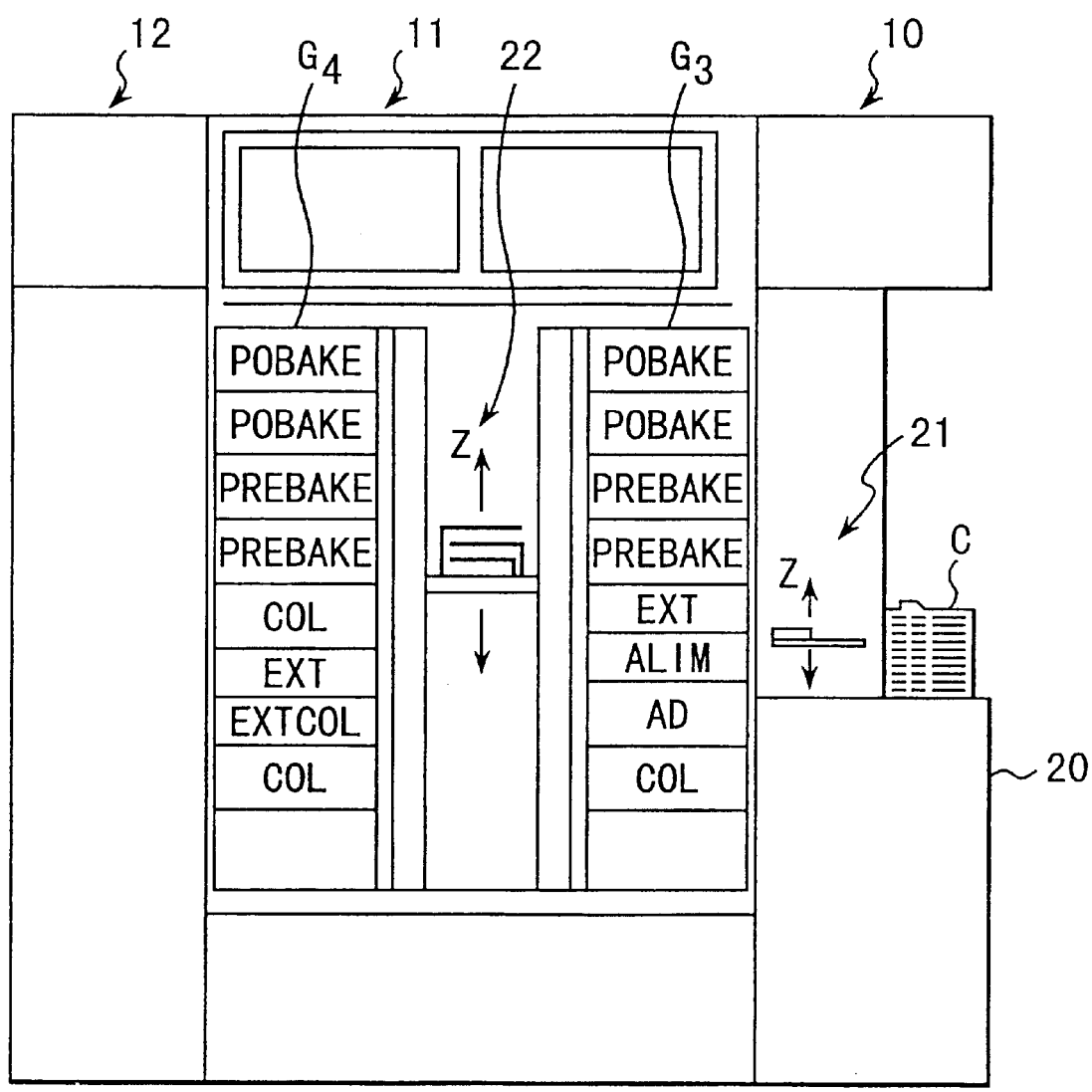
FIG. 3 is a rear view schematically showing the treatment apparatus.

FIGS. 1 to 3 are views for illustrating the general construction of a coating/developing apparatus 1 as a treatment apparatus according to an embodiment of the present invention. FIG. 1 is a plan view, FIG. 2 is a front view, and FIG. 3 is a rear view.

The coating/developing apparatus 1 comprises a cassette station 10, a treatment station 11, and an interface section 12, which are connected integrally to one another. In the cassette station 10, a plurality of wafers W as substrates, e.g., 25 wafers, in each cassette C are loaded into or unloaded from the apparatus 1 or each cassette C. In the treatment station 11, various sheet-type treatment units for treating each wafer W in specific manners in a coating/developing process are arranged in tiers in predetermined positions. The interface section 12 serves to deliver the wafer W between the treatment station 11 and an exposure unit (not shown) adjacent thereto.

In the cassette station 10, as shown in FIG. 1, a plurality of cassettes C, up to four in number, are placed corresponding to positioning lugs 20a on a cassette stage 20 for use as a bearing section, in a line in the X-direction (vertical direction in FIG. 1) with their respective wafer apertures directed to the treatment station 11. A wafer transportation member 21 is movable along a transportation path 21a. The member 21 can move in the cassette arrangement direction (X-direction) and the arrangement direction (Z-direction or vertical direction) of the wafers in each cassette C. Thus, the cassettes C can be accessed alternatively.

Further, the wafer transport member 21 is rotatable in the θ-direction, so that it can also access an alignment unit (ALIM) and an extension unit (EXT) that belong to a multistage unit section of a third treatment unit group $G_3$ on the treatment station side, as mentioned later.

As shown in FIG. 1, the treatment station 11 is provided with main wafer transportation means 22 of a vertical transportation type in its central portion, and one or more sets of various treatment units, which constitute treatment unit groups, are stacked in tiers around the transportation means 22. Five treatment unit groups $G_1$, $G_2$, $G_3$, $G_4$ and $G_5$ can be arranged in the coating/developing apparatus 1 according to the present embodiment. The first and second treatment unit groups $G_1$ and $G_2$ are located on the front side of the apparatus 1, and the third and fourth treatment unit groups $G_3$ and $G_4$ are located adjacent to the cassette station 10 and the interface section 12, respectively. Further, the fifth treatment unit group $G_5$ (indicated by broken line) can be disposed on the rear side of the apparatus 1.

In the first treatment unit group $G_1$, as shown in FIG. 2, two spinner-type treatment units, e.g., a resist coating unit (COT) and a developing unit (DEV), are successively stacked in tiers from below. Each of these treatment units subjects the wafers W on a spin chuck in a cup CP to a specific treatment. Also in the second treatment unit group $G_2$, two such spinner-type treatment units are successively stacked in tiers from below.

In the third treatment unit group $G_3$, as shown in FIG. 3, oven-type treatment units for subjecting the wafers W on a stage (not shown) to specific treatments are successively stacked in eight tiers, for example, from below. These units include, for example, a cooling unit (COL), adhesion unit (AD) for the so-called adhesion treatment for improving the grab of the resist, alignment unit (ALIM), extension unit (EXT), pre-baking unit (PREBAKE) for a heat treatment before an exposure treatment, and a post-baking unit (POBAKE).

Also in the fourth treatment unit group $G_4$, oven-type treatment units, such as a cooling unit (COL), extension-cooling unit (EXTCOL), extension unit (EXT), cooling unit (COL), pre-baking unit (PREBAKE), and a post-baking unit (POBAKE), are successively stacked in eight tiers, for example, from below.

Thus, the cooling unit (COL) and the extension-cooling unit (EXTCOL), which use low treatment temperatures, are located in the lower tiers, and the baking unit (PREBAKE), post-baking unit (POBAKE), and adhesion unit (AD), which use high treatment temperatures, on the upper tiers. By doing this, thermal interference between the units can be restrained. In consideration of leakage of HMDS (hexamethyldisilazine) used, the adhesion unit (AD) may be set in the lowest tier.

As shown in FIG. 1, the interface section 12 has the same dimension as the treatment station 11 with respect to the depth direction (X-direction) and has a smaller size in the width direction. As shown in FIGS. 1 and 2, a portable pickup cassette CR and a stationary buffer cassette BR are arranged in tiers in the front portion of the interface section 12, while a peripheral exposure unit 23 is disposed in the rear portion. Further, a wafer transportation member 24 is provided in the central portion of the interface portion 12. The transportation member 24 can move in the X-direction and Z-direction (vertical direction) to access both the cassettes CR and BR and the exposure unit 23. The member 24 can also rotate in the θ-direction to access the extension unit (EXT), which belongs to the fourth treatment unit group $G_4$ on the treatment station side, and a wafer delivery stand (not shown) on the side of the exposure unit (not shown) adjacent thereto.

Figure 4:
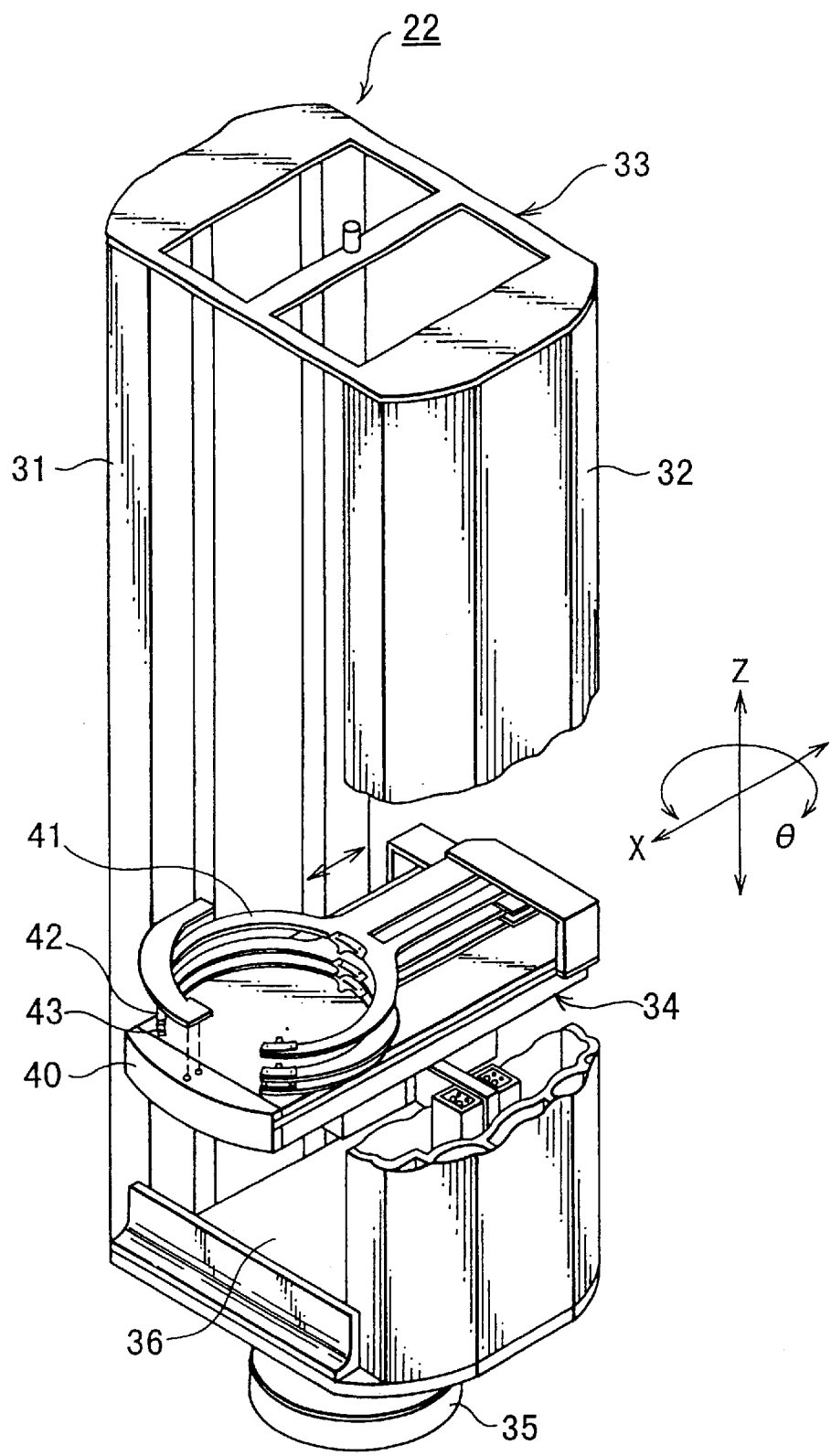
FIG. 4 is a perspective view schematically showing a main wafer transportation mechanism used in the treatment apparatus.

As shown in FIG. 4, the main wafer transportation means 22 is provided with a wafer transportation unit 34 for up-and-down motion in the vertical or Z-direction inside a cylindrical support 33. The support 33 is composed of a pair of vertical wall portions 31 and 32, which face each other with their respective upper and lower ends connected to one another. The cylindrical support 33 is connected to a rotating shaft of a motor 35, and is rotated integrally with the transportation unit 34 around the motor shaft by means of the driving force of the motor 35. Thus, the transportation unit 34 is rotatable in the θ-direction.

The wafer transportation unit 34 is provided with a plurality of retaining members, e.g., three forceps 41, 42 and 43, on a transportation base 40. These forceps are movable in the longitudinal direction of the base 40, e.g., in the X-direction of FIG. 4. Any of these forceps 41, 42 and 43 has a shape and size such that it can pass through a side aperture 36 between the vertical wall portions 31 and 32 of the cylindrical support 33. Each forceps can be moved in the aforesaid longitudinal direction by means of a drive motor (not shown) in the transportation base 40 and a belt (not shown). Each wafer W can be held by means of any of the forceps 41, 42 and 43. Normally, the uppermost forceps 40 is used in carrying out processes from a cooling process to a resist coating process. The second-tier forceps 42 and the lowermost forceps are used in the transportation of the wafers W that is free from bad influences of thermal interference.

As shown in FIG. 2, moreover, a high-performance filter 51, such as an ULPA filter, is provided for each of the aforesaid three zones (cassette station 10, treatment station 11, and interface section 12), in the upper portion of the coating/developing apparatus 1. In this arrangement, down flows of clean air are formed and fed to the cassette stage 20, transportation path 21a of the wafer transportation member 21, first to fifth treatment unit groups $G_1$ to $G_5$, and interface section 12. Air supplied from the upper-stream side of the filters 51 is cleared of particles as it passes through the filers, and forms clean down flows, as indicated by full- and broken-line arrows in FIG. 2. For the resist coating unit (COT) and the developing unit (DEV), which produce organic components in the apparatus 1, ducts are suitably arranged so that clean down flows are formed also in these units. The apparatus 1 is set on a top-layer floor 52, such as a grating panel or perforated panel, in a clean room that has a double-bottomed structure.

Figure 5:
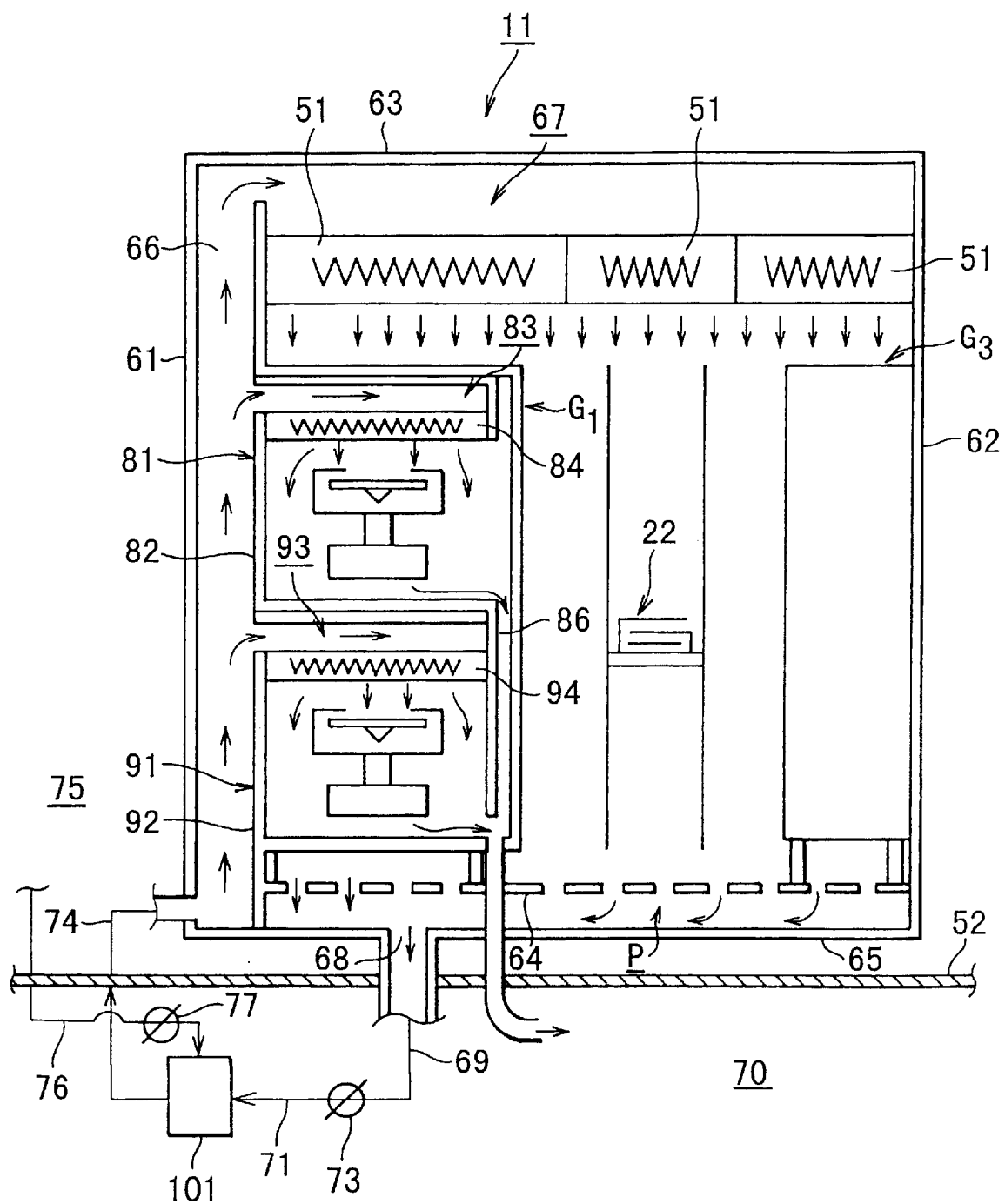
FIG. 5 is a sectional view schematically showing the treatment apparatus.

As shown in FIG. 5, the treatment station 11 is surrounded by side plates 61 and 62 and other members, and a top plate 63 and a bottom plate 65 are provided at the upper and lower parts, respectively, of the station 11. A space P is defined between the bottom plate 65 and a vent-hole plate 64. A wall duct 66, which is formed on one side of the apparatus 1, opens into a ceiling chamber 67 that is defined under the top plate 63.

The bottom plate 65 is formed having an exhaust port 68. A lower-stream atmosphere in the apparatus 1, which is recovered through the vent-hole plate 64, is introduced into a lower space 70 in the double-bottomed structure of the clean room, which is partitioned by the top-layer floor 52, by means of an exhaust pipe 69 connect to the exhaust port 68. The lower-stream atmosphere in the apparatus 1, recovered through the exhaust port 69, can be reused, since it contains no or very little alkaline components, such as ammonia.

If any of the exhaust air from the treatment station 11 is discharged into a centralized exhaust system in a plant, as mentioned before, air in an upper space 75 of the double-bottomed structure of the clean room is introduced into an impurity removing apparatus 101 through an air-supply pipe 76 in order to make good the loss. After the alkaline components such as ammonia are removed by gas-liquid contact, the introduced air is mixed with the air recovered through the exhaust pipe 69. The resulting air mixture is delivered to the wall duct 66 through a delivery pipe 74. In this case, the rate of admission is adjustable by means of a damper 77.

On the other hand, the high-performance filters 51 are arranged under the ceiling chamber 67. The clean air delivered from the impurity removing apparatus 101 flows through the wall duct 66 and is then blown out as down flows into the apparatus 1 through the filters 51.

A sub-chamber 83 is separately formed in the upper part of a casing 82 that constitutes an outside wall of a developing unit (DEV) 81 in the first treatment unit group $G_1$ in the treatment station 11. The sub-chamber 83 communicates with the wall duct 66 of the apparatus 1. Thus, the cleaned air that flows through the duct 66 is discharged as down flows into the DEV 81 through a high-performance filter 84, which is set under the sub-chamber 83. An atmosphere in the DEV 81 is discharged from a separate exhaust pipe 86 into the centralized exhaust system (not shown) in the plant through a separate exhaust duct (not shown).

Likewise, a resist coating unit (COT) 91 is constructed so that a sub-chamber 93 is separately formed in the upper part of a casing 92, the sub-chamber 93 communicating with the wall duct 66. Thus, the cleaned air that flows through the duct 66 is discharged as down flows into the COT 91 through a high-performance filter 94, which is set under the sub-chamber 93. An atmosphere in the COT 91 is also discharged into the centralized exhaust system (not shown) in the plant through a separate exhaust duct (not shown).

In some cases, desirable process conditions can be obtained if the air flow rate and the like are set for each of the treatment units described above. Therefore, miniature fans, variable dampers, etc. may be provided in the respective sub-chambers 83 and 93 of the DEV 81 and the COT 91 so that independent clean down flows can be formed individually for the DEV 81 and the COT 91.

The following is a description of the construction of the impurity removing apparatus 101 as a removing apparatus according to the present invention. As shown in FIG. 6, the apparatus 101 generally comprises an inlet section 110, first impurity removing section 130, second impurity removing section 150, outlet section 170, and impurity remover circulating section 190.

The air thus recovered from the treatment station 11 flows through an inlet pipe 71 and is introduced into a space S through an inlet port 111 in the inlet section 110. The air introduced through the port 111 is regulated into a uniform flow by the space S and fed into the first impurity removing section 130 through a ventilating pipe 133. In the present embodiment to be described hereinafter, pure water is used as an impurity remover.

The first impurity removing section 130 is provided with a spraying unit 131 having spray nozzles 131a for spraying fine mists of pure water into a gas-liquid contact space $M_1$. The space $M_1$ is underlain by a dispersion mat 132, whereby the pure water sprayed from the nozzles 131a is trapped, dispersed, and dripped uniformly. The mat 132 is formed of nonwoven fabric, for example.

Located under the dispersion mat 132 is a pan 133 for collecting the pure water dripping from the mat 132. The pan 133 is vertically penetrated by ventilating pipes 133a for guiding the air rising from the space S to the dispersion mat 132 and the gas-liquid contact space $M_1$. The impurity remover is supplied from a supply unit 135A into pan 133 via a pipe 135. In order to maintain the level of the pure water collected in the pan 133, moreover, the pan 133 is fitted with a drain pipe 134 for draining an overflow. Another drain pipe 135 is attached to the base portion of the pan 133.

Provided between the dispersion mat 132 and the pan 133, furthermore, are umbrella-shaped caps 136, for example, lest the pure water from the mat 132 drip directly into a drain pan 112. In order to prevent the pure water from dripping, each cap 136 is located right over its corresponding ventilating pipe 133a with an appropriate air gap secured between them.

A mist collecting section 137 for use as a mist trap is provided in the top portion of the first impurity removing section 130. The section 137 serves to remove mists in the air having passed through the gas-liquid contact space $M_1$. The collecting section 137 may be formed of nonwoven fabric or a large number of alternately arranged fins that can cause a gas to run against liquid drops, thereby removing the drops and collecting mists in the gas.

The second impurity removing section 150, which is located right over the first impurity removing section 130, has basically the same construction as the first section 130. More specifically, a pan 153 having ventilating pipes 153a is set in the bottom portion of the removing section 150, and umbrella-shaped caps 156, for example, are provided over the pipes 153a, individually. The ventilating pipes 153a also have a function to guide an overflow of the pure water from the pan 153 into the first impurity removing section 130. A dispersion mat 152 and a spraying unit 151 are provided in a gas-liquid contact space $M_2$ over the caps 156. The mat 152 serves temporarily to trap, disperse, and uniformly drip the pure water. The spraying unit 151 includes spray nozzles 151a for spraying fine mists of pure water. A mist collecting section 157 for use as a mist trap is provided in the top portion of the second impurity removing section 150.

In the present embodiment, the first and second impurity removing sections 130 and 150 are arranged in two tiers, lower and upper, as shown in FIG. 6. According to this arrangement, the overflow of the pure water used in the second or upper removing section 150 and collected in the pan 153 can be fed to the first or lower removing section 130. Accordingly, fresh pure water need not be supplied to the first removing section 130 on the lower side, so that pure water can be saved. According to the present embodiment, as described above, the impurity removing sections are arranged in two tiers, upper and lower. Alternatively, however, three or more impurity removing sections may be vertically arranged to form a multistage structure. In this case, the removing rate for impurities in the air can be improved. For compactness, on the other hand, the impurity removing apparatus 101 may be provided with only one impurity removing section.

As shown in FIG. 6, a suitable number of ultraviolet-light irradiation units 161 are arranged over the pan 133 of the first impurity removing section 130. Ultraviolet rays emitted from the irradiation units 161 can subject a suitable range including the pure water in the pan 133 and its surroundings to sterilization.

The air cleared of the impurities by the first and second impurity removing sections 130 and 150 is guided to the outlet section 170. The relatively clean air in the upper space 75 is introduced into the outlet section 170 through an air-supply port 172. After the impurity-free air and the air introduced through the port 172 are mixed, the temperature and humidity of the resulting mixture are adjusted by means of a heating mechanism 173 and a humidifying mechanism 174, which will be mentioned later. Thereafter, the mixture is discharged from the delivery pipe 74 by means of a blower 171.

More specifically, the air cleared of the impurities and the air from the air-supply port 172 are mixed on the lower-stream side of the mist collecting section 157, and the heating mechanism 173 for heating the air mixture and the humidifying mechanism 174 are arranged in succession on the lower-stream side. In this arrangement, fine mists (having particle diameters of hundreds of micrometers or less) having failed to be removed by the collecting section 157 are evaporated by the heating mechanism 173. Thus, the blower 171 and other devices on the lower-stream side can be prevented from being adversely affected by water. The heating mechanism 173, which has a function to heat the air mixture to a given temperature, may be formed of, for example, an electric heater or a heating coil that utilizes heat source water. The humidifying mechanism 174 has a function to humidify the air, heated to the given temperature by the heating mechanism 173, to a given humidity. The humidifying mechanism 174 may be based on any of various humidifying systems, including the ultrasonic vibration system, spraying system, heat evaporation system, etc. The air adjusted to desired temperature and humidity, e.g., temperature of 23° C. and relative humidity of 40%, is discharged from an outlet port 175. The heating and humidifying mechanisms 173 and 174 are controlled by means of a separate control unit (not shown), so that air can be delivered under optionally set temperature and humidity conditions.

The impurity remover circulating section 190 is provided with a circulation system for feeding the pure waters collected in the respective pans 133 and 153 of the first and second impurity removing sections 130 and 150 into the spraying units 131 and 151, respectively.

The pure water collected in the pan 133 is returned through a circulating pipe 191 to the spraying unit 131 to be reused therein. The quantity of circulated pure water can be adjusted by means of a pump 192 in the pipe 191.

The pure waters recovered from the pans 133 and 153 are fed under pressure to the spraying units 131 and 151 by the pump 192 in the circulating pipe 191 and a pump 202 in a circulating pipe 202a, respectively. Heat exchangers 204a and 204b for heat exchange with refrigerants in refrigerators 203a and 203b are inserted in the pipes 191 and 193, respectively. The exchangers 204a and 204b can adjust the pure waters to be fed to the spraying units 131 and 151 to appropriate temperatures. A controller 102 is constructed to control each of the components 73, 77, 135A, 135a, 155, 161, 171, 173, 174, 192, 197A, 198, 202, 203a and 203b.

The following is a description of the operation of the coating/developing apparatus 1 according to the present embodiment constructed in this manner. First, in the cassette station 10, the wafer transportation member 21 accesses to a cassette C that is stored with untreated wafers W and placed on the cassette stage 20, and takes out one of the wafers W from the cassette C. Then, the transportation member 21 moves to the alignment unit (ALIM) in the multistage unit section of the third treatment unit group $G_3$ on the treatment station side, and transfers the wafer W to the ALIM.

When orientation-flat alignment and centering of the wafer W in the ALIM are finished, the wafer transportation unit 34 of the main wafer transportation means 22 receives the aligned wafer W, moves to the position just in front of the adhesion unit (AD), which is situated directly under the ALIM in the third treatment unit group $G_3$, and then load the wafer W into the apparatus 1. In the individual treatment units, the wafer W is subjected to specific treatments, such as resist coating.

During the treatments in the treatment units of the coating/developing apparatus 1 arranged in this manner, cleaned down flows at a given speed of, e.g., 0.35 m/s to 0.5 m/s are formed in the apparatus 1. Particles produced in the apparatus 1 are transported downward by these down flows, and are introduced into the recovery port 172 of the impurity removing apparatus 101 via the vent-hole plate 64 and the space P. Thereupon, the particles are removed by means of the high-performance filters 51 in the treatment station 11.

The air introduced from the upper space 75 through the inlet port 111 is guided to the dispersion mat 132 via the ventilating pipes 133a that penetrate the pan 133. The particles and impurities, such as organic components, ions, alkaline components, etc. contained by the air are removed by the pure water with which the mat 132 is soaked. The air having passed through the mat 132 is cleared of the impurities by gas-liquid contact with the mists of pure water from the spraying unit 131, in the gas-liquid contact space $M_1$. Thus, the air pre-filtered, in a word, by the dispersion mat 132 is cleared again of the impurities in the contact space $M_1$, so that the removal efficiency is very high. The mists are seized by the mist collecting section 137.

The air having passed through the mist collecting section 137 is guided to the dispersion mat 152 and further into the gas-liquid contact space $M_2$ via the ventilating pipes 153a that penetrate the pan 153. Thereupon, the mat 152 and the space $M_2$, like the dispersion mat 132 and the gas-liquid contact space $M_1$, remove the impurities. As this impurity removal is repeated, the impurity content of the air can be reduced to a very low level. According to the present embodiment, the impurity removal is expected to be repeated twice. Alternatively, however, the frequency of the impurity removal may be increased to improve the impurity removal efficiency further.

The air, thus cleared of the impurities, is introduced into the blower 171 after the mists therein are seized by the mist collecting 157. In the blower 171, the impurity-free air is mixed with the relatively clean air introduced through the air-supply port 172 and recovered from the treatment station 11 through the exhaust pipe 69. The resulting air mixture is run through the heating mechanism 173 and the humidifying mechanism 174 and discharged from the outlet port 175. In the present embodiment, the air in the upper space 75 of the double-bottomed structure Of the clean room, in which the coating/developing apparatus 1 is set, is introduced through the inlet port 111. Alternatively, however, an independent source of supply may be provided separately.

The mists of pure water sprayed from the spray nozzles 151a of the spraying unit 151 are temporarily trapped by the dispersion mat 152. Thereafter, some of them are collected directly into the pan 153, and the others via the caps 156. The pure water collected in the pan 153 is fed through the circulating pipe 193 by means of the pump 202. Further, an appropriate quantity of pure water is supplied from a pure water storage section in the plant 197A through a pure water supply pipe 197. After the supplied pure water is mixed with the pure water drained from the pan 153, the resulting mixture is returned to the spraying unit 151 via the supply pipe 201, and is sprayed again in the gas-liquid contact space $M_2$.

The pure water sprayed from the spraying unit 151 is adjusted to the most suitable temperature, e.g., 7° C., for the removal of the impurities in the air by means of a heat exchanger 204b that is inserted in the supply pipe 202a.

If the quantity of pure water that is returned to the spraying unit 151 by means of the pump 202 in the supply pipe 202a is increased, the mists of pure water in the gas-liquid contact space $M_2$ increase. As in the aforementioned case, therefore, the removal efficiency for the impurities in the air is improved.

If the rate of drainage of the pure water from the pan 153 into an intermediate tank 194 is reduced in order to the improve the removal efficiency of the gas-liquid contact space $M_2$ and the dispersion mat 152 for the impurities in the air, as described above, the pure water naturally overflows the pan 153, and the resulting overflow drips through the ventilating pipes 153a that penetrate the pan 153. The pure water passes through the mist collecting section 137, gas-liquid contact space $M_1$, dispersion mat 132, and caps 136 to be collected in the pan 133. The pure water collected in the pan 133 is delivered to the spraying unit 131 by the circulating pipe 191 and sprayed into the gas-liquid contact space $M_1$. If the flow rate of the pure water delivered from the pan 133 to the spraying unit 131 by means of the pump 192 is increased, the mists of pure water in the gas-liquid contact space $M_1$ increase, so that the removal efficiency for the impurities in the air is improved.

Since the pure water collected and stored in the pan 133 is used in the second impurity removing section, as mentioned before, it is supposed to contain a fixed quantity of impurities. Since the pure water in the pan 133 is stagnant, moreover, microorganisms, such as sundry germs, algae, etc., are liable to multiply in the pan 133 and its surroundings. According to the present embodiment, however, sterilization can be effected by irradiation with ultraviolet rays from the irradiation units 161. By this sterilization, the multiplication of the microorganisms in the pure water circulation system of the impurity removing apparatus 101 can be restrained efficiently, and the maintenance cycle of the apparatus 101 can be lengthened. With use of ultraviolet rays, in particular, the sterilization can be carried out without stopping the operation of the impurity removing apparatus 101, and therefore, the operation of the coating/developing apparatus 1. Thus, the throughput is improved.

Figure 7:
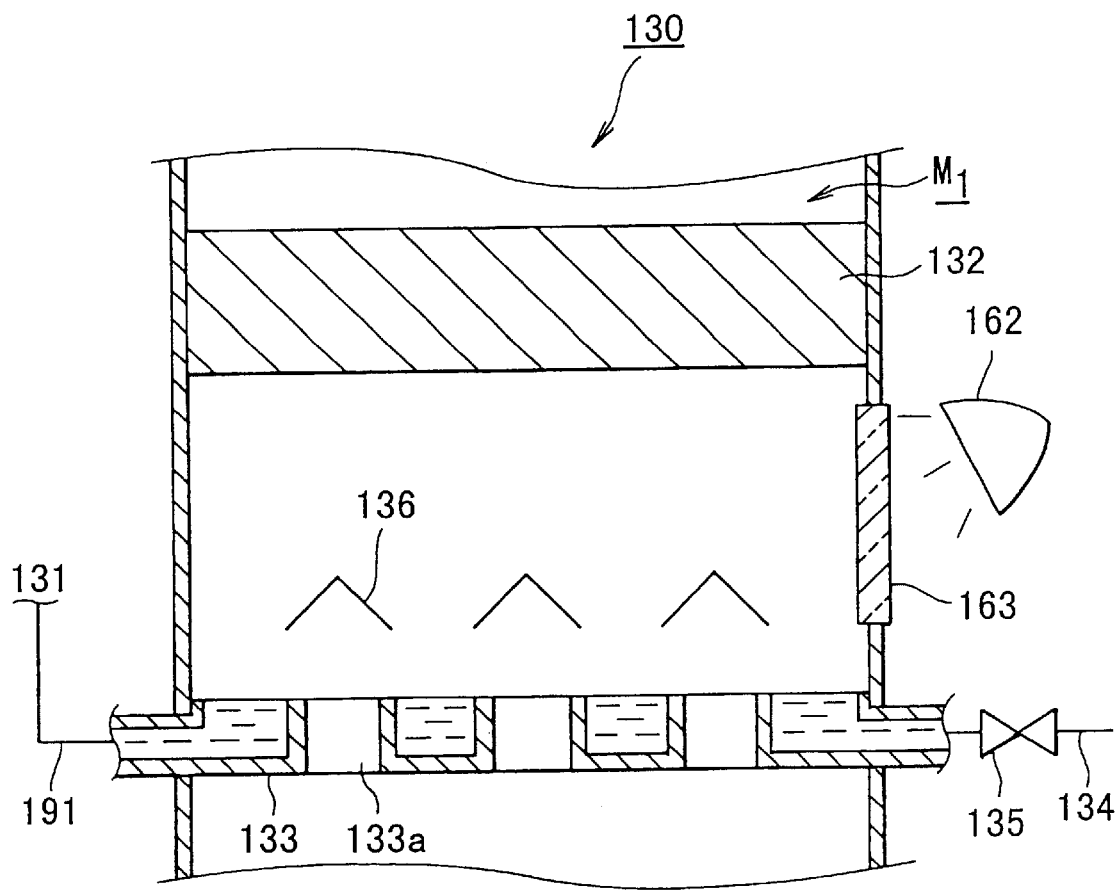
FIG. 7 is an enlarged view showing a principal part of the impurity removing apparatus of FIG. 6.

According to the present embodiment, as shown in FIG. 6, the ultraviolet-light irradiation units 161 are located over the pan 133. Alternatively, however, they may be located over the pan 153 of the second impurity removing section 150 and/or in the intermediate tank 194 of the impurity remover circulating section 190. In consideration of the maintainability of the irradiation units 161 themselves, an ultraviolet-light irradiation unit 162 may be provided outside the impurity removing apparatus 101 so that ultraviolet rays can be applied to the interior of the apparatus 101 through an irradiation window 163 of, for example, silica glass, as shown in FIG. 7. According to this arrangement, the maintenance of the irradiation unit 162 is easy in case of failure, since the unit 162 is located outside the impurity removing apparatus 101. Referring to FIG. 7, moreover, the ultraviolet-light irradiation unit 162 is situated in one position outside the first impurity removing section 130. Naturally, however, the irradiation window 163 may be provided in any other suitable position such that ultraviolet rays can be applied to the interior of the apparatus 101.

Figure 8:
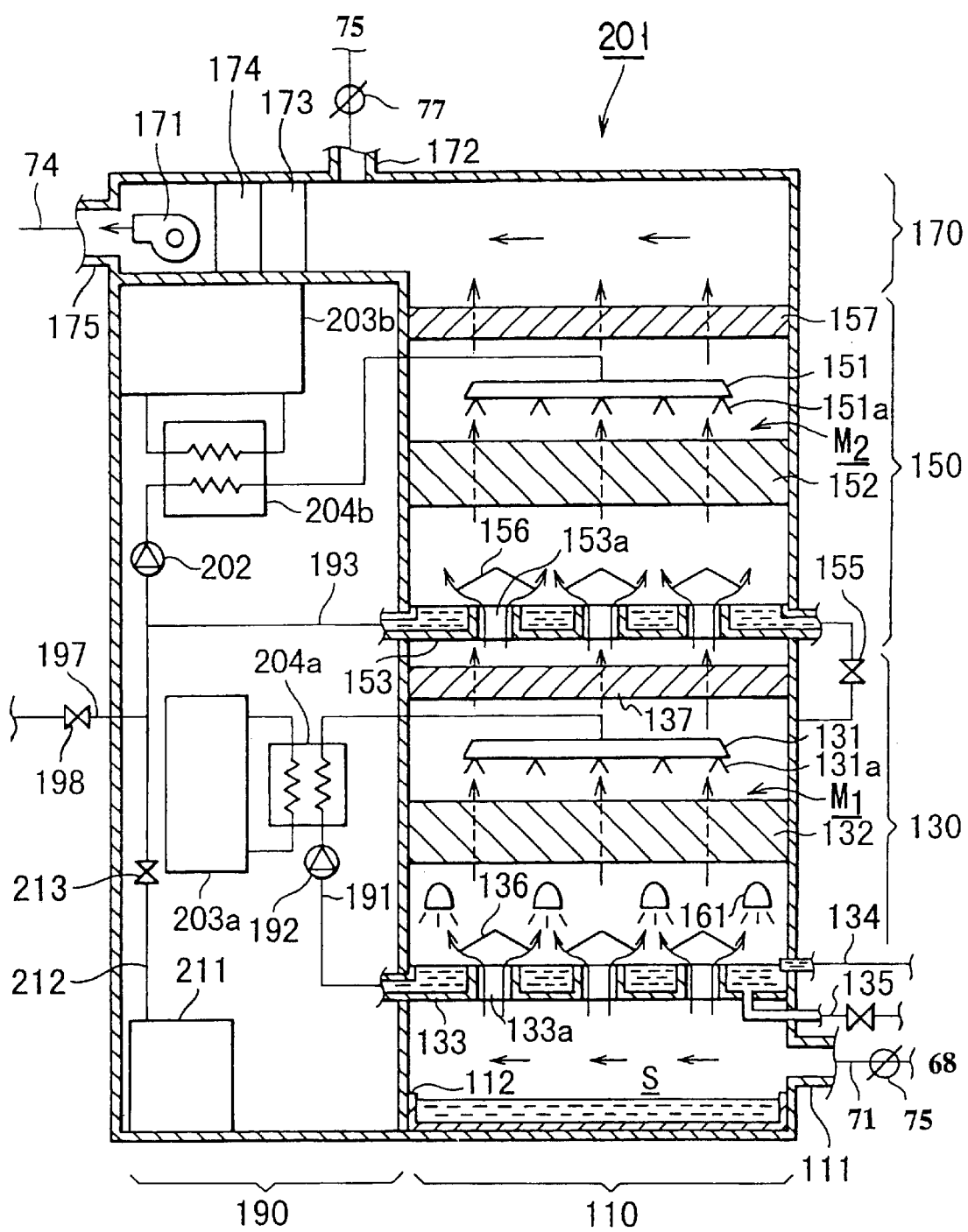
FIG. 8 is a sectional view schematically showing another impurity removing apparatus used in the treatment apparatus.

An impurity removing apparatus 201 shown in FIG. 8 may be used in place of the impurity removing apparatus 101 described above. As regards the arrangement for the removal of impurities in the air, the apparatus 201 is constructed in the same manner as the apparatus 101. However, the apparatus 201 employs an additional method for the sterilization of circulated pure water besides ultraviolet-light irradiation. More specifically, a biocide tank 211 stored with a biocide is set in the impurity remover circulating section 190 so that the biocide can be supplied through a biocide pipe 212. The quantity of biocide supply can be adjusted by means of a valve 213. For example, $H_2O_2$ (hydrogen peroxide solution) may be used as the biocide. The following is a description of the case where $H_2O_2$ is used as the biocide.

According to this arrangement, $H_2O_2$ can be mixed with pure water in a suitable ratio. Since the pure water containing $H_2O_2$ circulates in an impurity remover circulation system in the impurity removing apparatus 201, joint portions and other fine parts can be subjected to sterilization. Further, a different biocide than $H_2O_2$ may be used as one that can tackle microorganisms in pure water. Furthermore, the $H_2O_2$ concentration can be adjusted easily, and efficient sterilization can be enjoyed.

Before starting the $H_2O_2$ sterilization, a valve 198 is first closed to stop the supply of pure water from the plant 197A to the circulating pipe 193. Then, the valve 213 is opened, and $H_2O_2$ is fed from the biocide tank 211 into the intermediate tank 194 at a suitable flow rate. The pure water containing $H_2O_2$ circulates in the impurity circulation system in the impurity removing apparatus 201, whereby all regions of the apparatus 201 that are reached by the pure water can be sterilized. For example, the microorganisms in the pure water that is stored in the pan 133 may be counted by means of a measuring device, such as a particle counter (not shown), as the valve 213 is adjusted. Thus, if the capability for sterilization is insufficient, the valve 213 is opened to increase the $H_2O_2$ supply, thereby positively ensuring the sterilization.

There may be proposed an alternative method in which all the pure waters in the impurity circulation system in the impurity removing apparatus 201 are drained before $H_2O_2$ is supplied. In this case, the pure waters in the pans 133 and 153 are drained from the apparatus 201 by opening valves 135 and 155, respectively. After the valves 135 and 155 are closed, thereafter, $H_2O_2$ is supplied from the biocide tank 211. According to this method, microorganisms, such as sundry germs, algae, etc., having been contained by the pure waters are discharged together with the waters from the impurity removing apparatus 201. Since $H_2O_2$ only is used from the beginning for the sterilization, moreover, a stronger germicidal action can be expected.

Figure 9:
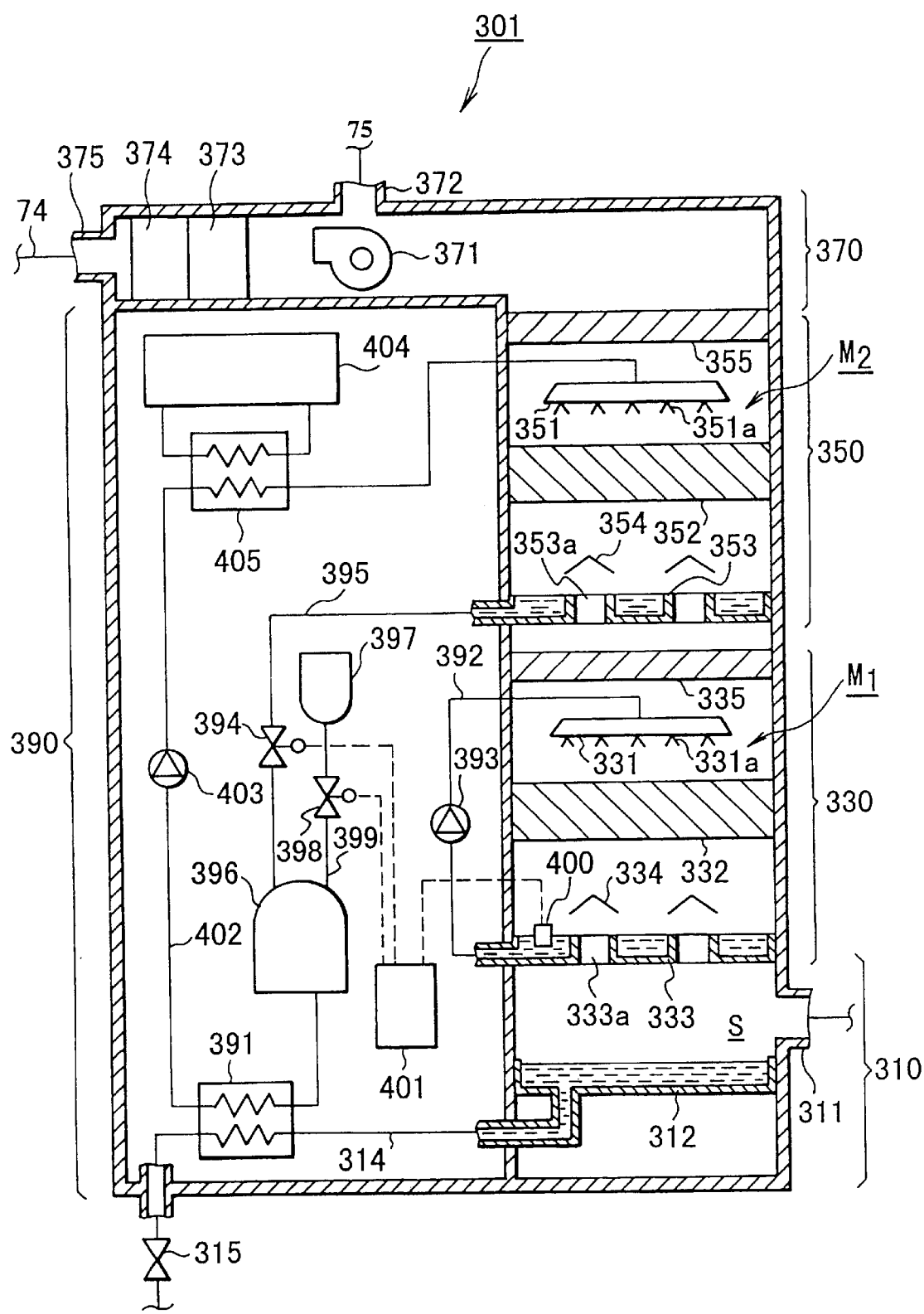
FIG. 9 is a sectional view schematically showing still another impurity removing apparatus used in the treatment apparatus.

The following is a description of an impurity removing apparatus 301 according to another embodiment of the present invention. As shown in FIG. 9, the impurity removing apparatus 301 generally comprises an inlet section 310, first impurity removing section 330, second impurity removing section 350, outlet section 370, and impurity remover circulating section 390.

Some of the air recovered from the treatment station 11 in the aforementioned manner flows through the inlet pipe 71 and is introduced into a space S through an inlet port 311 in the inlet section 310. The inlet section 310 is provided with a drain pan 312 for storing some of an impurity remover, such as pure water, used in the first and second impurity removing sections 330 and 350. The impurity remover stored in the drain pan 312 is discharged into, for example, a waste water system in the plant via a heat exchanger 391 (mentioned later) by means of a drain pipe 314. The delivery of the impurity remover can be adjusted by means of a valve 315. The following is a description of the case where pure water is used as the impurity remover.

The first impurity removing section 330 is provided with a spraying unit 331 having spray nozzles 331a for spraying fine mists of pure water in a gas-liquid contact space $M_1$. The space $M_1$ is underlain by a dispersion mat 332 of, for example, nonwoven fabric, whereby the pure water sprayed from the nozzles 331a is trapped, dispersed, and dripped uniformly.

Located under the dispersion mat 332 is a pan 333 for collecting the pure water dripping from the mat 332. The pan 333 is vertically penetrated by ventilating pipes 333a for guiding the air rising from the space S to the dispersion mat 332 and the gas-liquid contact space $M_1$. The pipes 333a also have a function to guide an overflow of the pure water from the pan 333 into the drain pan 312.

Provided between the dispersion mat 332 and the pan 333 are umbrella-shaped caps 334, for example, lest the pure water from the mat 332 drip directly into the drain pan 312. In order to prevent the pure water from dripping, each cap 334 is located right over its corresponding ventilating pipe 333a with an appropriate air gap secured between them.

A mist collecting section 335 for removing mists in the air having passed through the gas-liquid contact space $M_1$ is provided in the top portion of the first impurity removing section 330.

The second impurity removing section 350, which is located right over the first impurity removing section 330, has basically the same construction as the first section 330. More specifically, a pan 353 having ventilating pipes 353a is set in the bottom portion of the removing section 350, and caps 354 are provided over the pipes 353a, individually. A dispersion mat 352 and a spraying unit 351 including spray nozzles 351a are provided in a gas-liquid contact space $M_2$ over the caps 354. A mist collecting section 355 is provided in the top portion of the second impurity removing section 350.

In the present embodiment, the first and second impurity removing sections 330 and 350 are arranged in two tiers, lower and upper, as shown in FIG. 9. According to this arrangement, the overflow of the pure water collected in the pan 353 of the second or upper removing section 350 can be fed to the first or lower removing section 330. Accordingly, fresh pure water need not be supplied to the first removing section 330 on the lower side, so that pure water can be saved.

The air, cleared of the impurities in the first and second impurity removing sections 330 and 350, is guided to a blower 371 in the outlet section 370. On the other hand, the relatively clean air in the upper space 75 is introduced into the outlet section 370 through an air-supply port 372. After the cleared air and the air introduced through the port 372 are mixed by means of the blower 371, the resulting air mixture is delivered to a heating mechanism 373 and a humidifying mechanism 374, which will be mentioned later.

The heating mechanism 373 has a function to heat the air delivered from the blower 371 to a given temperature. The humidifying mechanism 374 has a function to humidify the air, heated to the given temperature by the heating mechanism 373, to a given humidity. The air adjusted to desired temperature and humidity, e.g., temperature of 23° C. and relative humidity of 40%, is discharged from an outlet port 375. The heating and humidifying mechanisms 373 and 374 are controlled by means of a separate control unit (not shown), so that air can be delivered under optionally set temperature and humidity conditions.

The impurity remover circulating section 390 is provided with a circulation system for feeding the pure waters collected in the respective pans 333 and 353 of the first and second impurity removing sections 330 and 350 into the spraying units 331 and 351, respectively.

A pump 393 is inserted in a circulating pipe 392. The pure water collected in the pan 333 is fed under pressure to the spraying unit 331 by the pump 393 and sprayed by the unit 331. On the other hand, the pure water collected in the pan 353 can be discharged into an intermediate tank 396 through a drain pipe 395 in which an adjustable-opening valve 394 is inserted.

The intermediate tank 396 and a pure water resupply tank 397 are connected by means of a resupply pipe 399 in which an adjustable-opening valve 398 is inserted. Thus, fresh pure water stored impurity-free in the resupply tank 397 can be supplied to the intermediate tank 396.

Disposed in the pure water in the pan 333 of the first impurity removing section 330 is a concentration sensor 400 for detecting the impurity concentration of the pure water. A controller 401 opens or closes the valves 394 and 398 in accordance with the result of detection by the sensor 400.

The aforesaid heat exchanger 391 is provided on the lower-stream side of the intermediate tank 396 so that the pure water from the tank 396 can exchange heat with the pure water discharged from the drain pan 212. Further, the heat exchanger 391 is connected with a supply pipe 402. The pure water subjected to the heat exchange in the heat exchanger 391 is fed under pressure to the spraying unit 351 by a pump 403 that is inserted in the pipe 402. The supply pipe 402 is provided with a heat exchanger 405 for exchanging heat with a refrigerant in a refrigerator 404, whereby the pure water to be fed to the spraying unit 351 can be adjusted to a desired temperature.

According to the impurity removing apparatus 301 shown in FIG. 9, the air introduced through the inlet port 311 is guided to the dispersion mat 332 via the ventilating pipes 333a that penetrate the pan 333. The particles and impurities, such as organic components, ions, alkaline components, etc., contained by the air are removed by the pure water with which the mat 332 is impregnated. The air having passed through the mat 332 is cleared of the impurities by gas-liquid contact with the mists of pure water from the spraying unit 331, in the gas-liquid contact space $M_1$. Thus, the air pre-filtered, in a word, by the dispersion mat 332 is cleared again of the impurities in the contact space $M_1$, so that the removal efficiency is very high.

The air cleared of the impurities in the gas-liquid contact space $M_1$ is cleared of the mists in the mist collecting section 335. Thereafter, the cleared air is guided to the dispersion mat 352 and further into the gas-liquid contact space $M_2$ via the ventilating pipes 353a that penetrate the pan 353. Thereupon, the mat 352 and the space $M_2$, like the dispersion mat 332 and the gas-liquid contact space Ml, remove the impurities. As the impurity removal is thus carried out in two stages, highly clean air can be created despite the high impurity content of the recovered air. Although the impurity removal is repeated twice according to the present embodiment, the cleanness of the air may be further improved by increasing the frequency of the impurity removal.

The air cleared of the impurities in the gas-liquid contact space $M_2$ is cleared of the mists in the mist collecting section 355 and introduced into the blower 371. In the blower 371, the cleared air is mixed with the relatively clean air introduced from the upper space 75 through the air-supply port 372. The resulting air mixture is run through the heating mechanism 373 and the humidifying mechanism 374, and is discharged from the outlet port 375. In the present embodiment, the relatively clean air in the upper space 75 of the double-bottomed structure of the clean room, in which the coating/developing apparatus 1 is set, is introduced through the air-supply port 372. Alternatively, however, an independent source of supply may be provided separately.

The mists of pure water sprayed from the spray nozzles 351a of the spraying unit 351 for gas-liquid contact are temporarily trapped by the dispersion mat 352. Thereafter, some of them are collected directly into the pan 353, and the others along the respective top surfaces of the caps 354. Thereafter, an overflow of the pure water from the pan 353 drips through the ventilating pipes 353a that penetrate the pan 353. The pure water passes through the mist collecting section 335, gas-liquid contact space $M_1$, dispersion mat 332, and caps 334 to be collected in the pan 333. The pure water collected in the pan 333 is delivered to the spraying unit 331 by the circulating pipe 392 and sprayed in the gas-liquid contact space $M_1$. If the flow rate of the pure water delivered from the pan 333 to the spraying unit 331 by means of the pump 393 is increased, the mists of pure water in the gas-liquid contact space $M_1$ increase, so that the removal efficiency for the impurities in the air is improved.

Thus, the pure water used in the second or upper impurity removing section 350 can be reused in the first impurity removing section 330, so that pure water to be supplied anew can be saved.

As mentioned before, the pan 333 is provided with the concentration sensor 400 for detecting the impurity concentration of the pure water stored therein. Variation of the impurity concentration of the air recovered from the treatment station 11 is reflected remarkably in the impurity concentration of the contacted pure water collected in the pan 333. If the result of detection of the impurity concentration by the concentration sensor 400 is higher than a given value, the controller 401 controls the valves 394 and 398 so that fresh pure water is supplied from the pure water resupply tank 397 to the intermediate tank 396. Thus, low-impurity pure water is sprayed from the spraying unit 351, and the ability of the second impurity removing section 350 and the first impurity removing section 330 thereunder to remove the impurities from the recovered air can be improved.

If the result of detection of the impurity concentration by the concentration sensor 400 is higher than the given value, the controller 401 controls the valves 394 and 398 so that the fresh pure water is supplied from the pure water resupply tank 397. At the same time, the controller 401 may be designed to control the valves so that the supply of the fresh pure water is stopped or reduced in the case where the detection result of the impurity concentration is lower than the given value. By doing this, the pure water supply can be kept at the minimum necessary quantity for a given impurity concentration. Thus, excessive supply of fresh pure water can be prevented to lower the running costs.

Further, the pure water stored in the intermediate tank 396 is sprayed from the spraying unit 351 after it is adjusted to a given temperature, e.g., 7° C., by the heat exchanger 405 in the supply pipe 402, so that a high impurity removal effect can be expected.

The heat exchanger 405 is supplied with the pure water that is preadjusted in temperature in a manner such that it is caused to exchange heat with the pure water from the drain pan 312 by the preceding heat exchanger 391. In a pure water temperature adjustment process using the heat exchanger 405, therefore, the load on the refrigerator 404 for supplying the refrigerant to the exchanger 405 can be relieved.

Figure 10:
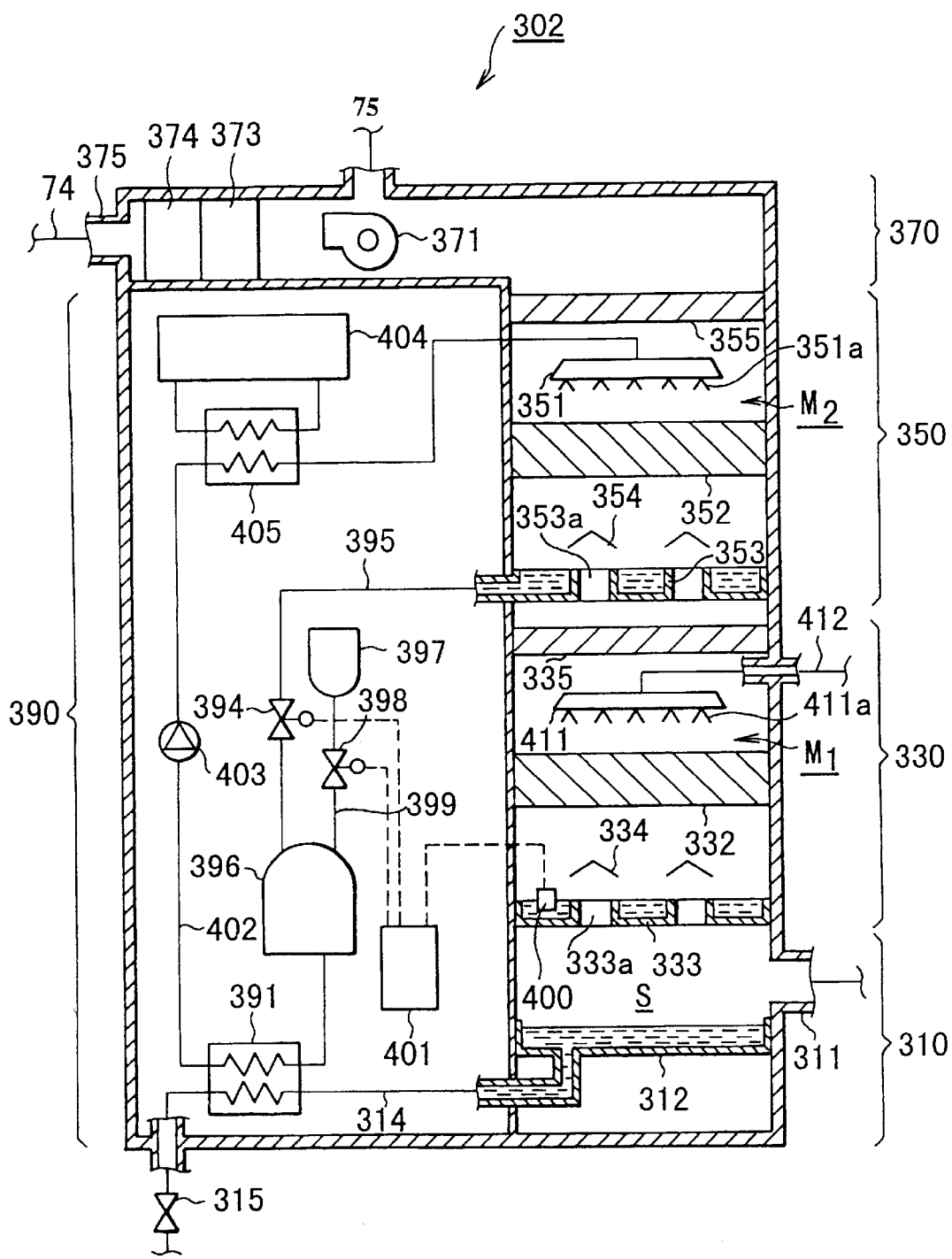
FIG. 10 is a sectional view schematically showing a further impurity removing apparatus used in the treatment apparatus.

An impurity removing apparatus 302 shown in FIG. 10 may be used in place of the impurity removing apparatus 301 described above. In this apparatus 302, tap water is supplied through the supply pipe 412 to a spraying unit 411 that belongs to the first impurity removing section 330 so that it is sprayed from spray nozzles 411a in the gas-liquid contact space $M_1$. The impurity removing apparatus 302 is constructed in the same manner as the foregoing impurity removing apparatus 301 except for members associated with the spraying unit 411. Therefore, like reference numerals are used to designate common members, and a description of those individual members is omitted.

In the impurity removing apparatus 302, two impurity removing sections are stacked in tiers, and the first impurity removing section 330, which is regarded as, so to speak, a prefilter, does not require a high impurity removal efficiency. Possibly, there-fore, the use of expensive pure water may overreach the specifications. To cope with this, the first impurity removing section 330 of the apparatus 302 is designed to use tap water that is high in both availability and handleability. Accordingly, the total quantity of pure water used in the impurity removing apparatus 302 can be reduced, so that the running costs can be lowered.

Although the impurity removing sections are arranged in two tiers, upper and lower, according to the embodiments described above, three or more impurity removing sections may be vertically arranged in tiers. In this case, the removal efficiency for impurities in the air can be improved further. Alternatively, moreover, some or all of necessary heat energy for the heating mechanism 373 may be derived from exhaust heat from the refrigerator 404. In other words, heat from the refrigerator 404 may be utilized for heating by means of the heating mechanism 373. By doing this, the energy-saving performance of the apparatus can be improved.

Figure 11:
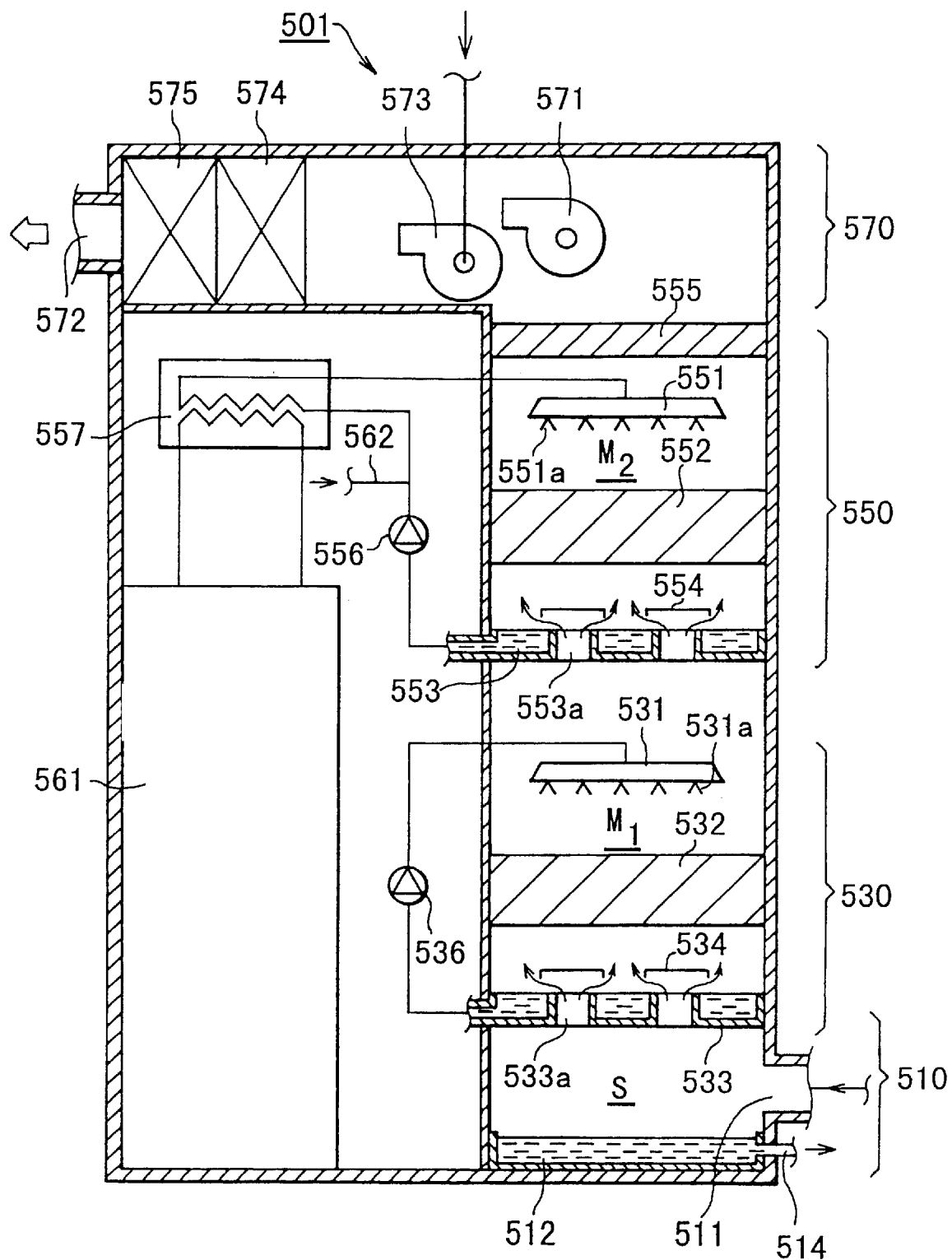
FIG. 11 is a sectional view schematically showing an alternative impurity removing apparatus used in the treatment apparatus.

Referring now to FIG. 11, an impurity removing apparatus 501 according to still another embodiment of the invention will be described. As shown in FIG. 11, the impurity removing apparatus 501 generally comprises an inlet section 510 formed inside a sheathed panel, first impurity removing section 530, second impurity removing section 550, outlet section 570, and impurity remover circulating section 590.

Air fed into the impurity removing apparatus 501 is first is introduced into a space S through an inlet port 511 in the inlet section 510. Provided in the lower part of the inlet section 510 is a drain pan 512 for storing some of an impurity remover, such as pure water, which is used in the first and second impurity removing sections 530 and 550. The impurity remover stored in the drain pan 512 is discharged into, for example, the waste water system in the plant by means of a drain pipe 514.

The first impurity removing section 530 is provided with a spraying unit 531 having spray nozzles 531a for spraying fine mists of pure water against a dispersion mat 532 of, for example, nonwoven fabric through a gas-liquid contact space $M_1$. The space $M_1$ is underlain by the dispersion mat 532, whereby the pure water sprayed from the nozzles 331a is trapped, dispersed, and dripped uniformly.

Located under the dispersion mat 532 is a pan 533 for collecting the pure water dripping from the mat 532. The pan 533 is vertically penetrated by ventilating pipes 533a as passages for guiding air, an object of treatment, rising from the space S thereunder to the dispersion mat 532. The pipes 533a also have a function to guide an overflow of the pure water from the pan 533 into the drain pan 512.

Arranged over the ventilating pipes 533a are caps 534 that are shaped so as to cover the respective apertures of their corresponding pipes 533a with gaps between them. The caps 534 serve to prevent the pure water from the dispersion mat 532 from dripping directly into the drain pan 512. Further, the air from the space S diffuses and rises to the mat 532 through the gaps after running against the caps 534. The pure water stored in the pan 533 is fed again to the spraying unit 531 by means of a pump 536 and sprayed from the spray nozzles 531a. Thus, the pure water can be circulated for reuse.

The second impurity removing section 550, which is located right over the first impurity removing section 530, has basically the same construction as the first section 530. More specifically, a pan 553 having ventilating pipes 553a is set in the bottom portion of the removing section 550, and caps 554 are provided over the pipes 553a, individually. A dispersion mat 552 is located over the caps 554, and a spraying unit 551 including spray nozzles 551 is disposed over the mat 552 with a gas-liquid contact space $M_2$ between them. A liquid drop removing filter 555 of, for example, nonwoven fabric is provided over the spraying unit 551, that is, on the lowest-stream side of the second impurity removing section 550. The fabric of the filter 555 has fiber diameters smaller than those of the material of the dispersion mat 552.

The pure water stored in the pan 553 is fetched by means of a pump 556 and subjected to heat exchange in a heat exchanger 557. In the impurity removing apparatus 501 according to the present embodiment, the pure water is cooled by exchanging heat with a refrigerant from a refrigerator 561 in the apparatus, whereby its temperature is adjusted to, for example, 7° C. There-after, the pure water, kept at 7° C., is fed again to the spraying apparatus 551 and sprayed from the spray nozzles 551a to be reused.

According to the present embodiment, the first and second impurity removing sections 530 and 550 are arranged in two tiers, upper and lower, as mentioned before. An overflow of the pure water used in the second or upper impurity removing section 550 and collected in the pan 553 drops into the first or lower impurity removing section 530. According to the present embodiment, however, fresh pure water is resupplied from a pure water resupply source 562. Accordingly, a quantity of pure water corresponding to the resupply drops into the first removing section 530 and is collected in the drain pan 512. Alternatively, three or more impurity removing sections may be arranged in tiers.

The air, cleared of impurities in the first and second impurity removing sections 530 and 550, is guided to an exit or an outlet port 572 by means of a blower 571 in the outlet section 570. On the other hand, the relatively clean air in the upper space 75 is introduced into the outlet section 570 by means of another blower 573 and mixed with the clean air cleared of the impurities in the first and second impurity removing sections 530 and 550. The resulting air mixture is adjusted for temperature and humidity by means of a heating mechanism 574 and a humidifying mechanism 575, and then discharged through the outlet port 572. The discharged air is adjusted to a temperature of 23° C. and a relative humidity of 40%, for example.

The following is a description of the operation of the impurity removing apparatus 501 constructed in this manner. During treatments in the treatment units of the coating/developing apparatus 1, as mentioned before, cleaned down flows at a given speed of, e.g., 0.35 m/s to 0.5 m/s are formed in the apparatus 1. Particles and impurities, such as organic components, ions, alkaline components, etc., produced in the apparatus 1 are transported downward by these down flows, and are introduced into the inlet port 511 of the impurity removing apparatus 501.

The recovered air introduced through the inlet port 511 is guided to the dispersion mat 532 through the ventilating pipes 533a that penetrate the pan 533. Since the pure water is then sprayed from the spray nozzles 531a against the mat 532, the particles and impurities, such as organic components, ions, alkaline components, etc., contained by the recovered air are removed by touching the pure water in the mat 532. The air having passed through the mat 532 is further cleared of the impurities by direct gas-liquid contact with the mists of pure water from the spraying unit 531, in the gas-liquid contact space $M_1$. Thus, the air pre-filtered, in a word, by the dispersion mat 532 is cleared again of the impurities in the contact space $M_1$, so that the removal efficiency is very high.

In this case, moreover, the recovered air is diffused by the caps 534 before it flows upward, and the dispersion mat 532 is uniformly impregnated with the sprayed pure water. Accordingly, the recovered air, as the object of treatment, is evenly cleared of the impurities.

The air thus cleared of the impurities in the gas-liquid contact space $M_1$ flows through the ventilating pipes 553a that penetrate the pan 553, and is further subjected to impurity removal by gas-liquid contact in the dispersion mat 552 and the gas-liquid contact space $M_2$ of the second impurity removing section 550. In this case, the pure water sprayed from the spray nozzles 551a of the second impurity removing section 550 is cleaner than that in the first impurity removing section 530, so that impurity removal of a higher degree can be achieved. Very clean air can be created by thus repeating the two-stage impurity removal. Since the temperature of the pure water used is adjusted to 7° C. by means of the heat exchanger 557, moreover, the impurity removal efficiency is further improved.

The air having undergone the two-stage impurity removal is cleared of mists by the liquid drop removing filter 555 and then blown to the outlet port 572 by the blower 571. Since the air to be delivered to the port 572 is also cleaned when the mists are removed there-from by the filter 555, its cleanness is very high. Before the clean air is discharged from the outlet port 572, furthermore, its temperature and humidity can be controlled by means of the heating and humidifying mechanism 574 and 575.

Thus, with use of the impurity removing apparatus 501 according to the present embodiment, the air recovered from the coating/developing apparatus 1 can be cleaned by gas-liquid contact with pure water and supplied again to the apparatus 1 and individual treatment units, e.g., resist coating units $COT_1$, and $COT_2$. Thus, a predetermined degree of cleanness can be attained without using a chemical filter. Since the pure water used in the impurity removal is circulated to be reused, moreover, the running costs can be lowered. Besides, temperature and humidity can be controlled. Conventionally, a mechanism (e.g., chemical filter) for removing impurities and mechanisms for controlling temperature and humidity are designed and arranged independently of one another. According to the impurity removing apparatus 501 of the present embodiment, however, the removal of impurities and the control of temperature and humidity can be easily achieved with use of a single unit construction.

Figure 12:
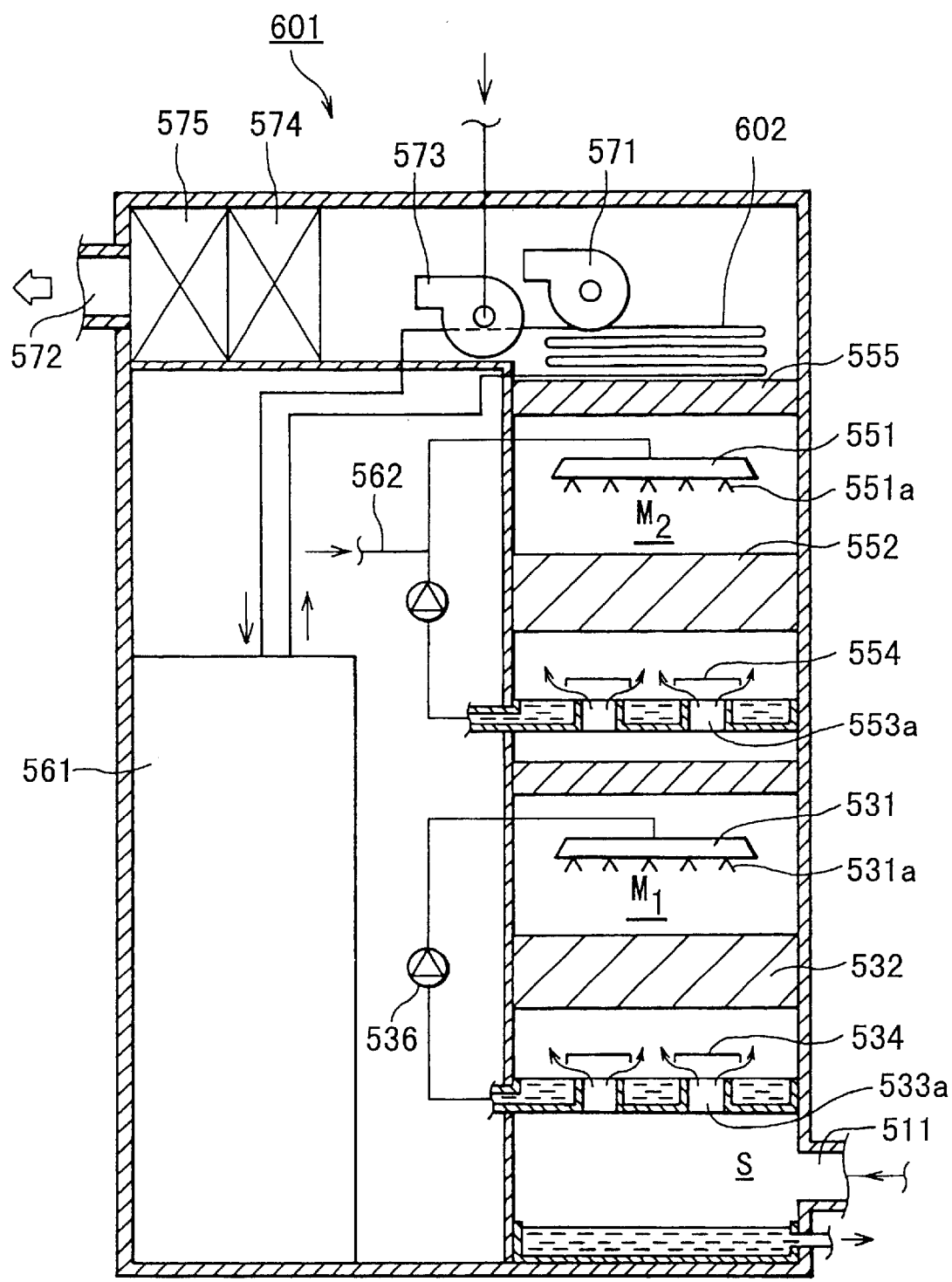
FIG. 12 is a sectional view schematically showing another impurity removing apparatus used in the treatment apparatus.

According to investigation made by the inventors hereof, high impurity removing capacity was able to be recognized when the temperature of pure water for use as an impurity remover was set at about 7° C. in removing impurities by gas-liquid contact. In the impurity removing apparatus 501 according to the present embodiment, therefore, the temperature of the pure water as the impurity remover is adjusted to 7° C. by means of the heat exchanger 557. Alternatively, an impurity removing apparatus 601 according to a further embodiment shown in FIG. 12 may be used to perform operation with high impurity removal efficiency. In FIGS. 11 and 12, like reference numerals refer to like members, units, mechanisms, etc.

In this impurity removing apparatus 601, as shown in FIG. 12, air on the lower-stream side of a filter 555 is cooled by means of a cooling coil 602 in the upper portion of the apparatus. The coil 602 communicates with a circulation circuit of a refrigerator 561 so that a refrigerant circulates therein. The cooling coil 602 is located between the filter 555 and blowers 571 and 573. Alternatively, it may be located between a heating mechanism 574 and the blowers 571 and 573.

Figure 13:
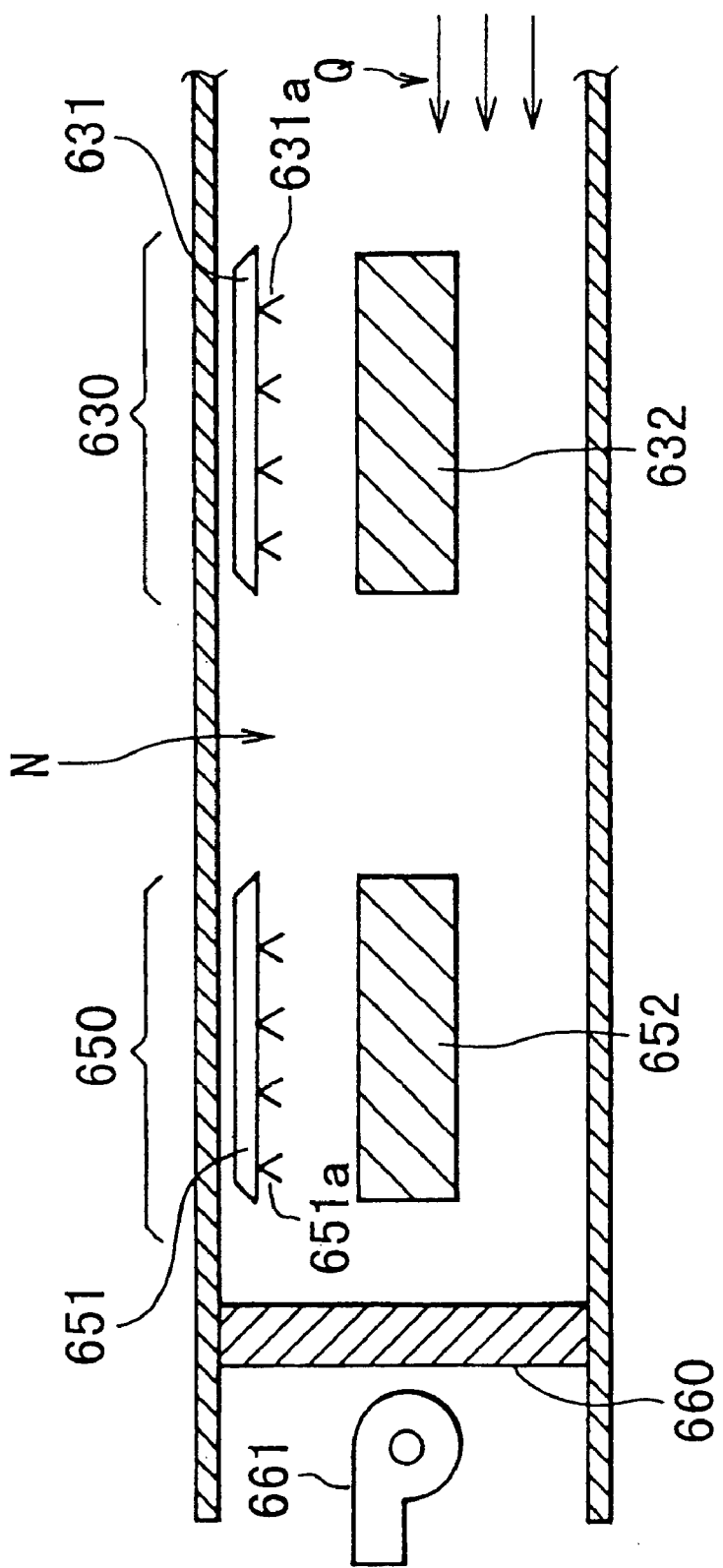
FIG. 13 is an enlarged view showing a principal part of a modification of the impurity removing apparatus of FIG. 12.

According to any of the embodiments described above, the impurity removing sections are arranged in tiers, upper and lower. Alternatively, however, first and second impurity removing sections 630 and 650 may be continuously arranged side by side, as shown in FIG. 13. In this case, a passage N for circulating recovered air Q is formed extending in the horizontal direction, and dispersion mats 632 and 652 of the removing sections 630 and 650 are arranged horizontally in the center of the passage N. Spraying units 631 and 651 having spray nozzles 631*a* and 651*a* for spaying an impurity remover against the mats 632 and 652 are located over their corresponding mats 632 and 652. A liquid drop removing filter 660 is set at right angles to the flowing direction of the recovered air Q, on the lower-stream side of the second impurity removing section 650 and on the upper-stream side of a blower 661. Thus, the filter 660 blocks up the passage N.

Even in the case where the first and second impurity removing sections 630 and 650 are thus arranged to form, so to speak, a horizontal multistage structure, impurities in the recovered air Q flowing in the passage N are removed by gas-liquid contact with the impurity remover sprayed from the spray nozzles 631*a* and 651*a* and the impurity dripping from the dispersion mats 632 and 652. Since liquid particles in the air cleared of the impurities are seized by the liquid drop removing filter 660 on the lower-stream side, the blower 661 can be operated without hindrance. The temperature and humidity of the air having passed through the filter 660 can be adjusted with ease.

According to the embodiment described above, the air recovered from the coating/developing apparatus 1 for subjecting wafers W to a series of treatments, including resist coating and developing, is supplied again to the apparatus 1 after it is cleaned. It is to be understood, however, that the air recovered from the individual treatment units may be supplied to the treatment units after it is cleaned. Further, the present invention may be also applied to apparatuses for forming films on wafers in a specified heated atmosphere, e.g., film forming apparatuses for forming oxide films. The substrate is not limited to a wafer, and may alternatively be a glass base for LCD.

According to the treatment apparatus of the present invention, as described herein, impurities in air recovered from a given space of the apparatus is removed in stages by gas-liquid contact. Even in case the impurity concentration of the recovered air is high, therefore, the impurities can be efficiently removed from the air to obtain a desired degree of cleanness. Thus, air with appropriate cleanness can be fed into the given space of the treatment apparatus, so that the atmosphere in the space can be kept clean. Since at least some of the impurity remover is reused, moreover, the impurity remover to be supplied afresh can be saved. Since the new supply of the impurity remover is adjusted in accordance with the result of detection by the concentration sensor, the necessary impurity remover can be saved, and the running costs can be lowered.

In the treatment apparatus of the invention, furthermore, multiplication of microorganisms, such as sundry germs, algae, etc., in the impurity remover can be restrained, so that the maintenance cycle of the apparatus can be lengthened. If an ultraviolet-light irradiation unit is used as a sterilizer, the impurity remover can be sterilized without stopping the removing apparatus, so that continuous operation can be carried out. Since no heat is used in the treatment, moreover, the temperature of the impurity remover can be kept constant, so that subsequent temperature control is easy.

According to the treatment method of the present invention, the impurity remover in the circulation system is discharged thoroughly, so that microorganisms in the impurity remover can be removed together. Accordingly, the entire process of sterilization can be accomplished with use of a biocide only, so that a stronger bactericidal action can be obtained. Naturally, the biocide may be added gradually or the sterilization may be finished by stopping the addition of the biocide when the microorganisms in the impurity remover are destroyed. Alternatively, sterilization may be started after stopping the treatment apparatus when a given value is exceeded by the number of microorganisms in the impurity remover that are counted by means of a measuring device, such as a particle counter. According to this method, the sterilization is carried out only at an appropriate time, so that the time for the interruption of the operation of the treatment apparatus required by the sterilization can be shortened. In consequence, the throughput can be improved.

According to the impurity removing apparatus of the present invention, the sprayed impurity remover is temporarily trapped by the dispersion mat, and is dispersed as it drips uniformly. Accordingly, air having passed through the dispersion mat touches the liquid particles of the impurity remover sprayed by means of the nozzles, whereby impurities can be removed. Thus, the efficiency of impurity removal from the recovered air is satisfactory. Further, the impurity remover dripped from the dispersion mat can be recovered with ease. Since the air can uniformly pass through the dispersion mat without local concentration, moreover, the impurities can be removed evenly.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A treatment method for treating a semiconductor wafer or an LCD class substrate in accordance with photolithography in an isolated treatment space in an air-conditioned clean room, comprising the steps of:

(a) preparing a process unit, a removing unit, and air collecting mechanism, an air supply mechanism, a spray mechanism for spraying an impurity remover, a gas-liquid contact portion wherein a sprayed impurity remover comes into fluid contact with collected air, a pan for temporarily storing the impurity remover, a sterilizer for sterilizing the impurity remover, a reuse circuit for reusing the impurity remover, an impurity remover replenishing mechanism, a supply pipe, and a heat exchanger;

(b) starting an operation of said removing unit, gathering at least some part of air in said process unit into said removing unit by means of said air collecting mechanism, replenishing a new impurity remover from said impurity remover replenishing mechanism, supplying said new impurity remover to a gas-liquid contact portion of a lowermost-stream side of an airflow after exchanging heat between said new impurity remover and an impurity remover discharged from a pan of an uppermost-stream side of the airflow, separating and removing alkaline components from said collected air, feeding purified air back to said process unit by means of said air supply mechanism, and supplying the impurity remover that is discharged from the pan of the uppermost-stream side of the air flow and that passes through the reuse circuit to the spray mechanism of the lowermost-stream side of the airflow;

(c) stopping the operation of said removing unit;

(d) discharging the impurity remover in said reuse circuit; and (e) supply a biocide to the purity remover in the reuse circuit with said sterilizer unit.

2. A treatment method according to claim 1, wherein tap water is supplied as an impurity remover to the spray mechanism of the lowermost-stream side from the gas-liquid contact portion of the uppermost-stream side in said step (b).

3. A treatment method according to claim 1, wherein the impurity remover adjusted within a temperature range of 6–8° C. is supplied to the gas-liquid contact portion of the lowermost-stream said in said step (b).

4. A treatment method for treating a semiconductor wafer or an LCD glad substrate in accordance with photolithography in an isolated treatment space in an air-conditioned clean room, comprising the steps of:

(A) preparing a process unit, a removing unit, an air collecting mechanism, an air supply mechanism, a spray mechanism for spraying an impurity remover, a gas-liquid contact portion wherein a sprayed impurity remover comes into fluid contact with collected air, a pan for temporarily storing the impurity remover, a sterilizer unit for sterilizing the impurity remover, a reuse circuit for reusing the impurity remover, an impurity remover replenishing mechanism, a supply pipe, and a heat exchanger;

(B) starting an operation of said removing unit, gathering at least some part of air in said process unit into said removing unit by means of said air collecting mechanism, replenishing a new impurity remover from said impurity remover replenishing mechanism, supplying said new impurity remover to a gas-liquid contact portion of a lowermost-stream side of an airflow after exchanging heat between said new impurity remover and impurity remover discharged from a pan of an uppermost-stream side of the airflow, separating and removing alkaline components from the collected air, feeding the purified air back to said process unit by means of said air supply mechanism, and supplying the impurity remover that is discharged from the pan of the uppermost-stream side of the air flow and that passes through the reuse circuit to the spray mechanism of the lowermost-stream side of the airflow;

(C) stopping the operation of said removing unit; and (D) supplying a biocide to the impurity remover in the reuse circuit with said sterilizer unit.

5. A treatment method according to claim 4, wherein tap water is supplied as a impurity remover to the gas-liquid contact portion of an uppermost-stream side in said step (B).

6. A treatment process according to claim 4, wherein the impurity remover adjusted within a temperature range of 6–8° C. is supplied to the gas-liquid contact portion of the lowermost-stream side in said step (B).

* * * * *